(12) United States Patent
Shiga et al.

(10) Patent No.: US 9,620,403 B2
(45) Date of Patent: Apr. 11, 2017

(54) ADHESIVE SHEET USED IN MANUFACTURE OF SEMICONDUCTOR DEVICE, ADHESIVE SHEET INTEGRATED WITH DICING TAPE, SEMICONDUCTOR DEVICE, AND METHOD OF MANUFACTURING SEMICONDUCTOR DEVICE

(71) Applicant: NITTO DENKO CORPORATION, Ibaraki-shi, Osaka (JP)

(72) Inventors: Goji Shiga, Ibaraki (JP); Naohide Takamoto, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/783,339

(22) PCT Filed: Apr. 3, 2014

(86) PCT No.: PCT/JP2014/059875
§ 371 (c)(1),
(2) Date: Oct. 8, 2015

(87) PCT Pub. No.: WO2014/168074
PCT Pub. Date: Oct. 16, 2014

(65) Prior Publication Data
US 2016/0056066 A1    Feb. 25, 2016

(30) Foreign Application Priority Data
Apr. 9, 2013  (JP) ................. 2013-081402

(51) Int. Cl.
*H01L 23/48*    (2006.01)
*H01L 23/52*    (2006.01)
(Continued)

(52) U.S. Cl.
CPC ............ *H01L 21/6836* (2013.01); *C08K 3/36* (2013.01); *C09J 7/0207* (2013.01); *C09J 7/0217* (2013.01);
(Continued)

(58) Field of Classification Search
CPC ........................... H01L 21/6836; C09J 7/0207
(Continued)

(56) References Cited

U.S. PATENT DOCUMENTS 8,258,232 B2    9/2012   Husemann et al.
2006/0134362 A1    6/2006   Lu et al.
(Continued)

FOREIGN PATENT DOCUMENTS

JP    2005-235915 A    9/2005
JP    2007-5611 A    1/2007
(Continued)

OTHER PUBLICATIONS

PCT/IB/338, with attached International Preliminary Report on Patentability and Written Opinion (PCT/ISA/237), received in counterpart PCT/JP2014/059875.
(Continued)

*Primary Examiner* — David S Blum
(74) *Attorney, Agent, or Firm* — Sughrue Mion, PLLC

(57) ABSTRACT

The present invention provides an adhesive sheet used in manufacture of a semiconductor device, containing a filler having an average particle size of 0.3 μm or less and an acrylic resin, wherein the content of the filler is in the range of 20 to 45% by weight with respect to the entire adhesive sheet, and the content of the acrylic resin is in the range of 40 to 70% by weight with respect to entire resin components.

8 Claims, 2 Drawing Sheets

(51) Int. Cl.
| | |
|---|---|
| *H01L 21/683* | (2006.01) |
| *C09J 133/04* | (2006.01) |
| *H01L 23/544* | (2006.01) |
| *C09J 7/02* | (2006.01) |
| *C08K 3/36* | (2006.01) |
| *C09J 133/08* | (2006.01) |
| *H01L 23/00* | (2006.01) |
| *C08K 3/00* | (2006.01) |
| *C08K 7/18* | (2006.01) |

(52) U.S. Cl.
CPC ............ *C09J 133/04* (2013.01); *C09J 133/08* (2013.01); *H01L 23/544* (2013.01); *H01L 24/17* (2013.01); *C08K 3/0033* (2013.01); *C08K 7/18* (2013.01); *C08K 2201/003* (2013.01); *C09J 2201/122* (2013.01); *C09J 2201/36* (2013.01); *C09J 2201/606* (2013.01); *C09J 2203/326* (2013.01); *C09J 2205/102* (2013.01); *C09J 2433/00* (2013.01); *H01L 24/16* (2013.01); *H01L 2221/68327* (2013.01); *H01L 2221/68377* (2013.01); *H01L 2223/54433* (2013.01); *H01L 2223/54453* (2013.01); *H01L 2223/54486* (2013.01); *H01L 2224/16225* (2013.01); *H01L 2224/16227* (2013.01); *H01L 2924/01014* (2013.01); *H01L 2924/0635* (2013.01)

(58) Field of Classification Search
USPC .......................................................... 257/690
See application file for complete search history.

(56) References Cited

U.S. PATENT DOCUMENTS

| | | |
|---|---|---|
| 2010/0289158 A1 | 11/2010 | Hong et al. |
| 2010/0314781 A1 | 12/2010 | Hayashi et al. |
| 2011/0217501 A1 | 9/2011 | Shishido et al. |
| 2012/0028050 A1 | 2/2012 | Shiga et al. |
| 2012/0153508 A1 | 6/2012 | Hayashi et al. |
| 2013/0095639 A1 | 4/2013 | Takamoto |

FOREIGN PATENT DOCUMENTS

| | | |
|---|---|---|
| JP | 2010-108987 A | 5/2010 |
| JP | 2011-506669 A | 3/2011 |
| JP | 2011-105875 A | 6/2011 |
| JP | 2011-187571 A | 9/2011 |
| JP | 2011-228496 A | 11/2011 |
| JP | 2011-249739 A | 12/2011 |
| JP | 2012-31234 A | 2/2012 |
| JP | 2013-28717 A | 2/2013 |
| WO | 2010/074060 A1 | 7/2010 |

OTHER PUBLICATIONS

International Search Report for PCT/JP2014/059875 dated Jul. 1, 2014 [PCT/ISA/210].
Japanese Office Action issued in corresponding Japanese Patent Application No. 2013-081402 dated Aug. 31, 2016.
Communication issued in corresponding Japanese Patent Application No. 2013-081402 issued Oct. 21, 2016.
Chinese Office Action issued in corresponding Chinese Patent Application No. 201480020512.2 issued Dec. 26, 2016.

ADHESIVE SHEET USED IN MANUFACTURE OF SEMICONDUCTOR DEVICE, ADHESIVE SHEET INTEGRATED WITH DICING TAPE, SEMICONDUCTOR DEVICE, AND METHOD OF MANUFACTURING SEMICONDUCTOR DEVICE

CROSS REFERENCE TO RELATED APPLICATIONS

This application is a National Stage of International Application No. PCT/JP2014/059875, filed on Apr. 3, 2014, which claims priority from Japanese Patent Application No. 2013-081402, filed on Apr. 9, 2013, the contents of all of which are incorporated herein by reference in their entirety.

TECHNICAL FIELD

The preset invention relates to an adhesive sheet used in manufacture of a semiconductor device, an adhesive sheet integrated with a dicing tape, a semiconductor device, and a method of manufacturing a semiconductor device.

BACKGROUND ART

In recent years, thinner and smaller semiconductor devices and packages thereof have been desired. Therefore, as a semiconductor device and a package thereof, a flip-chip type semiconductor device has been widely used. In the flip-chip type semiconductor device, a semiconductor element such as a semiconductor chip is mounted on a substrate by flip-chip bonding (flip-chip bonded). In the flip-chip bonding, the semiconductor chip is fixed to the substrate so that the circuit surface of the semiconductor chip faces the electrode formation surface of the substrate. In such a semiconductor device or the like, the backside of the semiconductor chip is sometimes protected with a protective film (film for the backside of a flip-chip type semiconductor) to prevent damage or the like of the semiconductor chip (for example, refer to Patent Document

PRIOR ART DOCUMENT

Patent Document

Patent Document 1: JP-A-2011-228496

SUMMARY OF THE INVENTION

Problems to be Solved by the Invention

Because the semiconductor chip has been made thinner in recent years, the semiconductor chip may be warped, and suppression of the warpage has been desired.

Since the film for the backside of a flip-chip type semiconductor is exposed to the outside, marking may be performed to impart various types of information. Therefore, high contrast of marking is required. Marking may be performed not only on the film for the backside of a flip-chip type semiconductor, but also on the adhesive sheet used in manufacture of a semiconductor device.

The present invention has been made in consideration of the above-described problems, and an object thereof is to provide an adhesive sheet that is capable of suppressing the generation of warpage of a semiconductor chip and has a high marking contrast at marking, an adhesive sheet integrated with a dicing tape, and a semiconductor device that is manufactured by using the adhesive sheet integrated with a dicing tape.

Means for Solving the Problems

The present inventors made investigations to solve the above-described problems. As a result, they found that the generation of warpage in the semiconductor chip can be suppressed and the marking contrast at marking can be increased by incorporating a prescribed content of a filler having a prescribed average particle size or less in an adhesive sheet and optimizing the content of an acrylic resin, and completed the present invention.

That is, the adhesive sheet according to the present invention is an adhesive sheet used in manufacture of a semiconductor device, containing a filler having an average particle size of 0.3 μm or less and an acrylic resin, wherein the content of the filler is in the range of 20 to 45% by weight with respect to the entire adhesive sheet, and the content of the acrylic resin is in the range of 40 to 70% by weight with respect to entire resin components.

According to the above-described configuration, the adhesive sheet contains a filler having an average particle size of 0.3 μm or less in an amount in the range of 20 to 45% by weight with respect to the entire adhesive sheet. Therefore, if the filler surface is exposed by marking, the unevenness of the exposed surface becomes fine. This allows the amount of reflected light of oblique lighting to increase, and the brightness of a marking processing part increases at reading of the marking. As a result, marking contrast at marking can be increased.

The adhesive sheet contains 40% by weight or more of an acrylic resin with respect to entire resin components. Therefore, the warpage of the semiconductor chip can be suppressed. Because the content of an acrylic resin is 70% by weight or less with respect to entire resin components, tackiness can be suppressed. As a result, the adhesion of a semiconductor chip to a suction collet or the like can be suppressed when the semiconductor chip is mounted.

When the filler having an average particle size of 0.3 μm or less (hereinafter sometimes referred to as a nano filler) is used, the contact area of the filler to the resin or the contact area between the filler particles increases and the elastic modulus tends to be high because the surface area of the filler is larger than that of a filler having an average particle size larger than 0.3 μm. This makes large warpage to be easily generated in the semiconductor device that is manufactured by using the adhesive sheet containing a nano filler. However, the content of the acrylic resin is kept within the above-described range in the present invention to control the elastic modulus and to suppress the warpage.

In the present invention, the adhesive sheet contains the filler having an average particle size of 0.3 μm or less in an amount in the range of 20 to 45% by weight with respect to the entire adhesive sheet to increase the marking contrast at marking, and the adhesive sheet contains the acrylic resin in an amount in the range of 40 to 70% by weight with respect to entire resin components to suppress the warpage that may be generated when a nano filler is used.

In the present description, the term "entire resin components" means the entire resin components excluding the filler (when the adhesive sheet contains a filler, entire resin components excluding the filler and the dye).

In the above-described configuration, the adhesive sheet is preferably a film for the backside of a flip-chip type semiconductor to be formed on the backside of a semiconductor element that is flip-chip bonded onto an adherend. Since the film for the backside of a flip-chip type semiconductor is formed on the backside of a semiconductor element, the generation of warpage in the semiconductor chip can be further suppressed. Since the film for the backside of a flip-chip type semiconductor is exposed to the outside, marking is often performed to impart various types of information. Therefore, if the adhesive sheet is used as the film for the backside of a flip-chip semiconductor that is required to have visibility of the marking, the adhesive sheet is further excellent in usability.

In the above-described configuration, the maximum particle size of the filler is preferably 0.5 μm or less. If the maximum particle size of the filler is 0.5 μm or less, the unevenness of the exposed surface when the filler surface is exposed by the marking is finer. Therefore, the marking contrast at marking can be further increased.

In the above-described configuration, the filler is preferably a silica filler. If the filler is a silica filler, the filler is excellent from the viewpoints of good dispersibility in a solvent and resistance to precipitation after the dispersion.

In the above-described configuration, the tensile storage elastic modulus at 23° C. of the adhesive sheet in an uncured state is preferably 1.0 to 3.0 GPa. If the tensile storage elastic modulus at 23° C. of the adhesive sheet in an uncured state is 1.0 to 3.0 GPa, the warpage of the semiconductor chip can be suppressed. Because the tackiness can also be suppressed, the adhesion of a semiconductor chip to a suction collet or the like can be suppressed when the semiconductor chip is mounted.

The adhesive sheet integrated with a dicing tape according to the present invention is intended to solve the above-described problems. The adhesive sheet integrated with a dicing tape includes a dicing tape and the adhesive sheet laminated on a dicing tape, wherein the dicing tape has a structure including a base and a pressure-sensitive adhesive layer laminated on the base, and the adhesive sheet is laminated on the pressure-sensitive adhesive layer.

The semiconductor device according to the present invention is intended to solve the above-described problems, and is manufactured by using the adhesive sheet integrated with a dicing tape.

The method of manufacturing a semiconductor device according to the present invention is intended to solve the above-described problems.

The method of manufacturing a semiconductor device according to the present invention is a method of manufacturing a semiconductor device using the adhesive sheet integrated with a dicing tape, and includes the steps of:

pasting a semiconductor wafer onto the adhesive sheet of the adhesive sheet integrated with a dicing tape, dicing the semiconductor wafer to form an semiconductor element, peeling the semiconductor element from the pressure-sensitive adhesive layer of the dicing tape together with the adhesive sheet integrated with a dicing tape, and flip-chip bonding the semiconductor element onto an adherend.

MODE FOR CARRYING OUT THE INVENTION

One embodiment of the present invention will be explained with reference to FIG. 1; however, the present invention is not limited to this example. The case will be explained below in which the adhesive sheet of the present invention is a film for the backside of a flip-chip type semiconductor; however, the adhesive sheet of the present invention is not limited to the film for the backside of a flip-chip type semiconductor, and for example, it may be a sealing film for sealing a chip by being pasted through lamination or the like to a substrate on which the chip is mounted from the chip side of the substrate.

Figure 1:
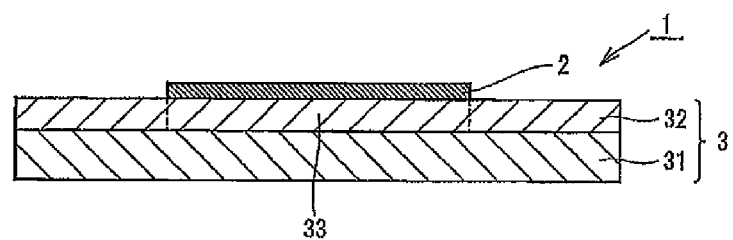
FIG. 1 is a schematic cross-sectional view showing one example of the film for the backside of a semiconductor integrated with a dicing tape according to one embodiment of the present invention.

FIG. 1 is a schematic cross-sectional view showing one example of the film for the backside of a semiconductor integrated with a dicing tape according to one embodiment of the present invention. In the drawings of the present description, there are the parts that are omitted because they are unnecessary for the explanation and the parts that are enlarged or shrunk to make the explanation easy.

(Film for Backside of Semiconductor Integrated with Dicing Tape)

As shown in FIG. 1, a film 1 for the backside of a semiconductor integrated with a dicing tape has a configuration including a dicing tape 3 including a base 31 and a pressure-sensitive adhesive layer 32 provided on the base 31, and a film 2 for the backside of a flip-chip type semiconductor (hereinafter sometimes referred to as a "film for the backside of a semiconductor") provided on the pressure-sensitive adhesive layer. The film 1 for the backside of a semiconductor integrated with a dicing tape corresponds to one embodiment of the adhesive sheet integrated with a dicing tape of the present invention. The film for the backside of a semiconductor integrated with a dicing tape of the present invention may have a configuration in which the film 2 for the backside of a semiconductor is formed only on a portion 33 corresponding to a pasting portion of the semiconductor wafer on the pressure-sensitive adhesive layer 32 of the dicing tape 3; alternatively, the film may have a configuration in which the film for the backside of a semiconductor is formed on the entire surface of the pressure-sensitive adhesive layer 32 or a configuration in which the film for the backside of a semiconductor is formed on a portion larger than the portion 33 corresponding to the pasting portion of the semiconductor wafer and smaller than the entire surface of the pressure-sensitive adhesive layer 32. The surface of the film 2 for the backside of a semiconductor (the surface of the film 2 that is pasted to the backside of the wafer) may be protected by a separator or the like until the film is pasted to the backside of the wafer.

(Film for Backside of Flip-chip Type Semiconductor)

The film 2 for the backside of a semiconductor has a film shape. The film 2 for the backside of a semiconductor is normally uncured (including a semi-cured state) when it is in the form of a film for the backside of a semiconductor integrated with a dicing tape as a product, and it is thermally cured after the film for the backside of a semiconductor integrated with a dicing tape is pasted to the semiconductor wafer (the details will be explained later).

The film 2 for the backside of a semiconductor contains a filler having an average particle size of 0.3 μm or less and an acrylic resin as a thermoplastic resin. The film for the backside of a semiconductor preferably further contains a thermosetting resin.

As described above, the film 2 for the backside of a semiconductor contains a filler having an average particle size of 0.3 μm or less. The average particle size of the filler is preferably 0.2 μm or less, and more preferably 0.1 μm or less. The average particle size of the filler may be 0.01 μm or more, 0.02 μm or more or 0.03 μm or more, for example.

The content of the filler is in the range of 20 to 45% by weight with respect to the entire film 2 for the backside of a semiconductor. The content of the filler is more preferably 25 to 40% by weight. The entire film for the backside of a semiconductor means the entire film for the backside of a semiconductor including the resin components and the filler, and when the film contains a dye, it means the entire film for the backside of a semiconductor including the resin components, the filler, and the dye.

Because the film 2 for the backside of a semiconductor contains the filler having an average particle size of 0.3 μm or less in an amount of 20 to 45% by weight with respect to the entire film 2 for the backside of a semiconductor, the unevenness of the exposed surface becomes fine when the surface of the filler is exposed to the surface of the film 2 for the backside of a semiconductor by the marking. This allows the amount of reflected light of oblique lighting to increase, and the brightness of a marking processing part increases at reading of the marking. As a result, marking contrast at marking can be increased.

The maximum particle size of the filler is preferably 0.5 μm or less, and more preferably 0.3 μm or less. If the maximum particle size of the filler is 0.5 μm or less, the unevenness of the exposed surface when the filler surface is exposed by the marking is finer. Therefore, the marking contrast at marking can be further increased.

The average particle size and the maximum particle size of the filler are values measured by using a laser diffraction particle size analyzer.

The shape of the inorganic filler is not especially limited, and it may be any of a spherical shape, an oval-spherical shape, a flat plate shape, a rod shape, a column shape, a layer shape, a chain shape, a scale shape, a donut shape, and an irregular shape. Regardless of the shape, the average particle size and the maximum particle size can be obtained based on the diameter of a sphere assuming that the target inorganic filler has a spherical shape.

The filler may be either of an inorganic filler and an organic filler; however, it is preferably an inorganic filler. A filler such as an inorganic filler is compounded to impart electric conductivity to the film for the backside of a semiconductor, to improve thermal conductivity, and to adjust the elastic modulus. The film 2 for the backside of a semiconductor may be electrically conductive or nonconductive. Examples of the inorganic filler include various types of inorganic powders of ceramics such as silica, clay, gypsum, calcium carbonate, barium sulfate, alumina oxide, beryllium oxide, silicon carbide and silicon nitride; metals such as aluminum, copper, silver, gold, nickel, chromium, lead, tin, zinc, palladium and solder; alloys; and carbon. The filler may be used either alone or in combination of two or more types. Among these fillers, a silica filler is preferable from the viewpoints of good dispersibility in a solvent and resistance to precipitation after the dispersion.

As described above, the film 2 for the backside of a semiconductor contains an acrylic resin. The content of the acrylic resin is in the range of 40 to 70% by weight with respect to entire resin components, and is preferably 45 to 65% by weight. Because the content of the acrylic resin is in the range of 40 to 70% by weight with respect to entire resin components, the warpage of the semiconductor chip can be suppressed.

When the filler having an average particle size of 0.3 μm or less (nano filler) is used, the contact area of the filler to the resin or the contact area between the filler particles increases and the elastic modulus tends to be high because the surface area of the filler is larger than that of a filler having an average particle size larger than 0.3 μm. This makes large warpage to be easily generated in the semiconductor device that is manufactured by using the film for the backside of a semiconductor containing a nano filler. However, the content of the acrylic resin is kept within the above-described range in the film 2 for the backside of a semiconductor according to the present embodiment to control the elastic modulus and to suppress the warpage.

As described above, the film 2 for the backside of a semiconductor according to the present embodiment contains the filler having an average particle size of 0.3 μm or less in an amount in the range of 20 to 45% by weight with respect to the entire film 2 for the backside of a semiconductor to increase the marking contrast at marking. Moreover, the film 2 for the backside of a semiconductor contains an acrylic resin in an amount in the range of 40 to 70% by weight with respect to entire resin components to suppress the warpage that may be generated when a nano filler is used.

The acrylic resin is not especially limited, and examples thereof include a polymer having one type or two types or more of acrylates or methacrylates having a linear or branched alkyl group having 30 or less carbon atoms (preferably 4 to 18 carbon atoms, further preferably 6 to 10 carbon atoms, and especially preferably 8 or 9 carbon atoms) as a component. That is, the acrylic resin of the present invention has a broad meaning and also includes a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (a lauryl group), a tridecyl group, a tetradecyl group, a stearyl group, and an octadecyl group.

Other monomers that can form the above-described acrylic resin (monomers other than an alkylester of acrylic acid or methacrylic acid having an alkyl group having 30 or less carbon atoms) are not especially limited. Examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl (meth)acrylate, and (4-hydroxymethylcyclohexyl)methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl(meth)acrylate, and (meth)acryloyloxynaphthalenesulfonic acid; and monomers which contain a phosphoric acid group, such as 2-hydroxyethylacryloyl phosphate. Among these, a carboxyl group-containing monomer is preferable from the viewpoint that the tensile storage modulus Ea of the die bond film can be set at a preferred value. (Meth)acrylate refers to an acrylate and/or a methacrylate, and every "(meth)" in the present invention has the same meaning.

Examples of the thermosetting resin include an epoxy resin, a phenol resin, an amino resin, an unsaturated polyester resin, a polyurethane resin, a silicone resin, and a thermosetting polyimide resin. The thermosetting resins can be used alone or two types or more can be used together. An epoxy resin having a small amount of ionic impurities that erode the semiconductor element is especially suitable as the thermosetting resin. Further, a phenol resin can be suitably used as a curing agent for the epoxy resin.

The epoxy resin is not especially limited, and examples thereof include bifunctional epoxy resins and polyfunctional epoxy resins such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a bisphenyl type epoxy resin, a naphthalene type epoxy resin, a fluorene type epoxy resin, a phenol novolak type epoxy resin, an ortho-cresol novolak type epoxy resin, a trishydroxyphenylmethane type epoxy resin, and a tetraphenylolethane type epoxy resin, a hydantoin type epoxy resin, a trisglycidylisocyanurate type epoxy resin, and a glycidylamine type epoxy resin.

Among the above-described epoxy resins, a novolak type epoxy resin, a biphenyl type epoxy resin, a trishydroxyphenylmethane type epoxy resin, and a tetraphenylolethane type epoxy resin are especially preferable. These epoxy resins are highly reactive with a phenol resin as a curing agent and are excellent in heat resistance.

The phenol resin acts as a curing agent for the epoxy resin, and examples thereof include novolak type phenol resins such as a phenol novolak resin, a phenol aralkyl resin, a cresol novolak resin, a tert-butylphenol novolak resin, and a nonylphenol novolak resin, a resol type phenol resin, and polyoxystyrenes such as polyparaoxystyrene. The phenol resins can be used alone or two types or more can be used together. Among these phenol resins, a phenol novolak resin and a phenol aralkyl resin are especially preferable because connection reliability of the semiconductor device can be improved.

The phenol resin is suitably compounded in the epoxy resin so that a hydroxyl group in the phenol resin to 1 equivalent of an epoxy group in the epoxy resin component becomes 0.5 to 2.0 equivalents. The ratio is more preferably 0.8 to 1.2 equivalents. When the compounding ratio goes out of this range, sufficient curing reaction does not proceed, and the characteristics of the epoxy resin cured substance easily deteriorate.

In the present invention, a thermal curing-accelerating catalyst for the epoxy resin and the phenol resin may be used. The thermal curing-accelerating catalyst is not especially limited, and can be appropriately selected from known thermal curing-accelerating catalysts. The thermal curing-accelerating catalyst may be used either alone or in combination of two or more types. Examples of the thermal curing-accelerating catalyst include an amine curing accelerator, a phosphorus curing accelerator, an imidazole curing accelerator, a boron curing accelerator and a phosphorus-boron curing accelerator.

The amine-based curing accelerator is not especially limited, and examples thereof include monoethanolamine trifluoroborate manufactured by Stella Chemifa Corporation and dicyandiamide manufactured by Nacalai Tesque, Inc.

The phosphorous-based curing accelerator (the phosphorous-based curing-accelerating catalyst) is not especially limited, and examples thereof include triorganophosphines such as triphenylphosphine, tributylphosphine, tri(p-methylphenyl)phosphine, tri(nonylphenyl)phosphine, and diphenyltolylphosphine; tetraphenylphosphonium bromide (trade name; TPP-PB); methyltriphenylphosphonium (trade name; TPP-MB); methyltriphenylphosphonium chloride (trade name; TPP-MC); methoxymethyltriphenylphosphonium (trade name; TPP-MOC); and benzyltriphenylphosphonium chloride (trade name; TPP-ZC) (all are manufactured by Hokko Chemical Industry Co., Ltd.). The triphenylphosphine-based compound is preferably substantially insoluble in an epoxy resin. If the phosphorus curing accelerator is insoluble in the epoxy resin, excess progress of the thermal curing can be suppressed. Examples of the thermosetting catalyst having a triphenylphosphine structure and substantially insoluble in an epoxy resin include methyltriphenylphosphonium (trade name; TPP-MB). "Insoluble" means that the thermosetting catalyst made of a triphenylphosphine-based compound is insoluble in a solvent made of an epoxy resin. In further detail, it means that no more than 10% by weight of the catalyst is soluble in the solvent at a temperature of 10 to 40° C.

Examples of the imidazole-based curing accelerator include 2-methylimidazole (trade name; 2MZ), 2-undecylimidazole (trade name; C11-Z), 2-heptadecylimidazole (trade name; C17Z), 1,2-dimethylimidazole (trade name; 1.2DMZ), 2-ethyl-4-methylimidazole (trade name; 2E4MZ), 2-phenylimidazole (trade name; 2PZ), 2-phenyl-4-methylimidazole (trade name; 2P4MZ), 1-benzyl-2-methylimidazole (trade name; 1B2MZ), 1-benzyl-2-phenylimidazole (trade name; 1B2PZ), 1-cyanoethyl-2-methylimidazole (trade name; 2MZ-CN), 1-cyanoethyl-2-undecylimidazole (trade name; C11Z-CN), 1-cyanoethyl-2-phenylimidazolium trimellitate (trade name; 2PZCNS-PW), 2,4-diamino-6-[2'-methylimidazolyl-(1')]-ethyl-s-triazine (trade name; 2MZ-A), 2,4-diamino-6-[2'-undecylimidazolyl-(1')]-ethyl-s-triazine (trade name; C11Z-A), 2,4-diamino-6-[2'-ethyl-4'-methylimidazolyl-(1')]-ethyl-s-triazine (trade name; 2E4MZ-A), 2,4-diamino-6-[2'-methylimidazolyl-(1')]-ethyl-s-triazine isocyanuric acid adduct (trade name; 2MA-OK), 2-phenyl-4,5-dihydroxymethylimidazole (trade name; 2PHZ-PW), and 2-phenyl-4-methyl-5-hydroxymethylimidazole (trade name; 2P4MHZ-PW) (all are manufactured by Shikoku Chemicals Corporation).

The boron-based curing accelerator is not especially limited, and examples thereof include trichloroborane.

The phosphorous-boron-based curing accelerator is not especially limited, and examples thereof include tetraphenylphosphonium tetraphenylborate (trade name; TPP-K), tetrtaphenylphosphonium tetra-p-triborate (trade name; TPP-MK), benzyltriphenylphosphonium tetraphenylborate (trade name; TPP-ZK), and triphenylphosphine triphenylborane (trade name; TPP-S) (all are manufactured by Hokko Chemical Industry Co., Ltd.).

The ratio of the thermal curing-accelerating catalyst to the entire amount of the thermosetting resin can be set at 0.01% by weight or more and 20% by weight or less. If the ratio of the thermal curing-accelerating catalyst is 0.01% by weight or more, the warpage of a semiconductor element can be effectively suppressed or prevented even if the semiconductor element that is flip-chip bonded onto an adherend is thin (for example, the thickness is 300 μm or less or even 200 μm or less). When the ratio of the thermal curing-accelerating catalyst is set at 20% by weight or less, the shrinking amount of the film for the backside of a flip-chip type semiconductor can be controlled to an adequate amount without becoming too large. The lower limit of the ratio of the thermal curing-accelerating catalyst is preferably 0.03% by weight or more (more preferably 0.05% by weight or more). The upper limit of the ratio is preferably 18% by weight or less (more preferably 15% by weight or less).

The film for the backside of a semiconductor is suitably formed of a resin composition containing an epoxy resin and a phenol resin or a resin composition containing an epoxy resin, a phenol resin, and an acrylic resin. Because these resins have few ionic impurities and high heat resistance, reliability of a semiconductor element can be secured.

It is important that the film 2 for the backside of a semiconductor has tackiness (adhesion) to the backside (the surface where a circuit is not formed) of a semiconductor wafer. The film 2 for the backside of a semiconductor can be formed of, for example, a resin composition containing an epoxy resin as the thermosetting resin. Because the film 2 for the backside of a semiconductor is crosslinked to some extent in advance, a polyfunctional compound that reacts with a functional group at the end of a molecular chain of the polymer is preferably added as a crosslinking agent at production. With this addition, adhering characteristics at high temperature can be improved and heat resistance can be improved.

The adhering strength (23° C., peeling angle 180°, peeling speed 300 mm/min) of the film for the backside of a semiconductor to a semiconductor wafer is preferably in a range of 0.5 N/20 mm to 15 N/20 mm, and more preferably 0.7 N/20 mm to 10 N/20 mm. By making the adhering strength 0.5 N/20 mm or more, the film is pasted to the semiconductor wafer and the semiconductor element with excellent adhesion, and generation of floating and the like can be prevented. In addition, generation of chip flying can be prevented when dicing the semiconductor wafer. Meanwhile, by making the adhering strength 15 N/20 mm or less, the film can be easily peeled from the dicing tape. The adhering strength of the film for the backside of a semiconductor to the semiconductor wafer can be measured as follows, for example. That is, a pressure-sensitive adhesive tape (trade name "BT315" manufactured by Nitto Denko Corporation) is pasted onto one surface of the film for the backside of a semiconductor wafer to reinforce the backside. Then, a semiconductor wafer having a thickness of 0.6 mm is pasted onto the surface of the film for the backside of a semiconductor having a length of 150 mm and a width of 10 mm, the film being reinforced from the backside, by a heat lamination method by reciprocating a roller of 2 kg once at 50° C. Then, the laminate is left on a hot plate (50° C.) for 2 minutes, and at normal temperature (about 23° C.) for 20 minutes. Then, the film for the backside of a semiconductor reinforced from the backside is peeled at a temperature of 23° C. under the conditions of a peeling angle of 180° and a tensile speed of 300 mm/min by using a peeling tester (trade name "Autograph AGS-J" manufactured by Shimadzu Corporation). The adhering strength is a value (N/10 mm wide) measured when the film for the backside of a semiconductor is peeled at the interface of the film for the backside of a semiconductor and the semiconductor wafer.

The crosslinking agent is not especially limited, and a known crosslinking agent can be used. Specific examples thereof include an isocyanate crosslinking agent, an epoxy crosslinking agent, a melamine crosslinking agent, a peroxide crosslinking agent, a urea crosslinking agent, a metal alkoxide crosslinking agent, a metal chelate crosslinking agent, a metal salt crosslinking agent, a carbodiimide crosslinking agent, an oxazoline crosslinking agent, an aziridine crosslinking agent, and an amine crosslinking agent. An isocyanate crosslinking agent and an epoxy crosslinking agent are preferable. The crosslinking agents can be used alone or two type or more can be used together.

Examples of the isocyanate crosslinking agent include lower aliphatic polyisocyanates such as 1,2-ethylene diisocyanate, 1,4-butylene isocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylene diisocyanate; and aromatic polyisocyanates such as 2,4-tolylene diisocyanate, 2,6-tolylene diisocyanate, 4,4'-diphenylmethane diisocyanate, and xylylene diisocyanate. A trimethylolpropane/tolylene diisocyanate trimer adduct (tradename: Coronate L manufactured by Nippon Polyurethane Industry Co., Ltd.) and a trimethylolpropane/hexamethylene diisocyanate trimer adduct (tradename: Coronate HL manufactured by Nippon Polyurethane Industry Co., Ltd.) can also be used. Examples of the epoxy crosslinking agent include N,N,N',N'-tetraglycidyl-m-xylenediamine, diglycidylaniline, 1,3-bis(N,N-glycidylaminomethyl)cyclohexane, 1,6-hexanediol diglycidylether, neopentylglycol diglycidylether, ethyleneglycol diglycidylether, propyleneglycol diglycidylether, polyethyleneglycol diglycidylether, polypropyleneglycol diglycidylether, sorbitol polyglycidylether, glycerol polyglycidylether, pentaerythritol polyglycidylether, polyglyserol polyglycidylether, sorbitan polyglycidylether, trimethylolpropane polyglycidylether, diglycidyl adipate, diglycidyl o-phthalate, triglycidyl-tris(2-hydroxyethyl)isocyanurate, resorcin diglycidylether, bisphenol-s-diglycidyl ether, and an epoxy resin having two or more epoxy groups in the molecule.

The used amount of the crosslinking agent is not especially limited, and can be appropriately selected according to the level of crosslinking. Specifically, the used amount of the crosslinking agent is normally preferably 7 parts by weight or less (0.05 to 7 parts by weight, for example) to 100 parts by weight of a polymer component (especially, a polymer having a functional group at the end of the molecular chain) for example. When the used amount of the crosslinking agent is more than 7 parts by weight to 100 parts by weight of the polymer component, it is not preferable because the adhering strength decreases. From the viewpoint of improving cohesive strength, the used amount of the crosslinking agent is preferably 0.05 parts by weight or more to 100 parts by weight of the polymer component.

In the present invention, it is possible to perform a crosslinking treatment by irradiation with an electron beam, an ultraviolet ray, or the like in place of using the crosslinking agent or together with a crosslinking agent.

The film for the backside of a semiconductor is preferably colored. With this configuration, the film for the backside of a semiconductor can exhibit an excellent marking property and an excellent appearance, and a semiconductor device can be obtained having an appearance with added value. Because the colored film for the backside of a semiconductor has an excellent marking property, various information such as character information and pattern information can be given to a semiconductor device or the surface where a circuit is not formed of the semiconductor device in which the semiconductor element is marked through the film for the backside of a semiconductor using various marking methods such as a printing method and a laser marking method. Especially, the information such as character information and pattern information that is given by marking can be recognized visually with excellent visibility by controlling the color. Because the film for the backside of a semiconductor is colored, the dicing tape and the film for the backside of a semiconductor can be easily distinguished, and workability can be improved. It is possible to color-code the semiconductor device by product, for example. When the film for the backside of a semiconductor is colored (when it is not colorless or transparent), the color is not especially limited. However, the color is preferably a dark color such as black, blue, or red, and black is especially preferable.

In this embodiment, the dark color means a dark color having L* that is defined in the L*a*b* color system of basically 60 or less (0 to 60), preferably 50 or less (0 to 50) and more preferably 40 or less (0 to 40).

The black color means a blackish color having L* that is defined in the L*a*b* color system of basically 35 or less (0 to 35), preferably 30 or less (0 to 30) and more preferably 25 or less (0 to 25). In the black color, each of a* and b* that is defined in the L*a*b* color system can be appropriately selected according to the value of L*. For example, both of a* and b* are preferably −10 to 10, more preferably −5 to 5, and especially preferably −3 to 3 (above all, 0 or almost 0).

In this embodiment, L*, a*, and b* that are defined in the L*a*b* color system can be obtained by measurement using a colorimeter (tradename: CR-200 manufactured by Konica Minolta Holdings, Inc.). The L*a*b* color system is a color space that is endorsed by Commission Internationale de l'Eclairage (CIE) in 1976, and means a color space that is called a CIE1976 (L*a*b*) color system. The L*a*b* color system is provided in JIS Z 8729 in the Japanese Industrial Standards.

When coloring the film for the backside of a semiconductor, a coloring material (coloring agent) can be used according to the objective color. Various dark color materials such as black color materials, blue color materials, and red color materials can be suitably used, and especially the black color materials are suitable. The color materials may be any of pigments, dyes, and the like. The color materials can be used alone or two types or more can be used together. Any dyes such as acid dyes, reactive dyes, direct dyes, dispersive dyes, and cationic dyes can be used. The pigments are also not especially limited in the form, and may be appropriately selected from known pigments.

When dyes are used as the color materials, the film for the backside of a semiconductor (consequently a film for the backside of a semiconductor integrated with a dicing tape) having uniform or almost uniform coloring concentration can be easily manufactured because the dyes disperse uniformly or almost uniformly due to dissolution in the film for the backside of a semiconductor. Because of that, when the dyes are used as the color materials, the coloring concentration of the film for the backside of a semiconductor integrated with a dicing tape can be made uniform or almost uniform, and the marking property and the appearance can be improved.

The black color material is not especially limited, and can be appropriately selected from inorganic black pigments and black dyes, for example. The black color material may be a color material mixture in which a cyan color material (blue-green color material), a magenta color material (red-purple color material), and a yellow color material are mixed together. The black color materials can be used alone or two types or more can be used together. The black color materials can be used also with other color materials other than black.

Specific examples of the black color materials include carbon black such as furnace black, channel black, acetylene black, thermal black, and lamp black, graphite (black lead), copper oxide, manganese dioxide, azo pigments such as azomethine azo black, aniline black, perylene black, titanium black, cyanine black, activated carbon, ferrite such as nonmagnetic ferrite and magnetic ferrite, magnetite, chromium oxide, iron oxide, molybdenum disulfide, chromium complex, complex oxide black, and anthraquinone organic black.

In the present invention, black dyes such as C. I. solvent black 3, 7, 22, 27, 29, 34, 43, and 70, C. I. direct black 17, 19, 22, 32, 38, 51, and 71, C. I. acid black 1, 2, 24, 26, 31, 48, 52, 107, 109, 110, 119, and 154, and C. I. disperse black 1, 3, 10, and 24; and black pigments such as C. I. pigment black 1 and 7 can be used as the black color material.

Examples of such black color materials that are available on the market include Oil Black BY, Oil Black BS, Oil Black HBB, Oil Black 803, Oil Black 860, Oil Black 5970, Oil Black 5906, and Oil Black 5905 manufactured by Orient Chemical Industries Co., Ltd.

Examples of color materials other than the black color materials include a cyan color material, a magenta color material, and a yellow color material. Examples of the cyan color material include cyan dyes such as C. I. solvent blue 25, 36, 60, 70, 93, and 95; and C. I. acid blue 6 and 45; and cyan pigments such as C. I. pigment blue 1, 2, 3, 15, 15:1, 15:2, 15:3, 15:4, 15:5, 15:6, 16, 17, 17:1, 18, 22, 25, 56, 60, 63, 65, and 66; C. I. vat blue 4 and 60; and C. I. pigment green 7.

Examples of the magenta color material include magenta dyes such as C. I. solvent red 1, 3, 8, 23, 24, 25, 27, 30, 49, 52, 58, 63, 81, 82, 83, 84, 100, 109, 111, 121, and 122; C. I. disperse red 9; C. I. solvent violet 8, 13, 14, 21, and 27; C. I. disperse violet 1; C. I. basic red 1, 2, 9, 12, 13, 14, 15, 17, 18, 22, 23, 24, 27, 29, 32, 34, 35, 36, 37, 38, 39, and 40; and C. I. basic violet 1, 3, 7, 10, 14, 15, 21, 25, 26, 27, and 28.

Examples of the magenta color material include magenta pigments such as C. I. pigment red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, and 245; C. I. pigment violet 3, 9, 19, 23, 31, 32, 33, 36, 38, 43, and 50; and C. I. vat red 1, 2, 10, 13, 15, 23, 29, and 35.

Examples of the yellow color material include yellow dyes such as C. I. solvent yellow 19, 44, 77, 79, 81, 82, 93, 98, 103, 104, 112, and 162; and yellow pigments such as C. I. pigment orange 31 and 43, C. I. pigment yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, and 195, and C. I. vat yellow 1, 3, and 20.

Various color materials such as cyan color materials, magenta color materials, and yellow color materials can be used alone or two types or more can be used together. When two types or more of various color materials such as cyan color materials, magenta color materials, and yellow color materials are used, the mixing ratio or the compounding ratio of these color materials is not especially limited, and can be appropriately selected according to the types of each color material and the intended color.

When coloring the film 2 for the backside of a semiconductor, the colored state of the layers is not especially limited. For example, the film for the backside of a semiconductor may be a single layered film in which the coloring agent is added. They may also be a laminated film in which at least a resin layer formed at least of a thermosetting resin and a coloring agent layer are laminated. When the film 2 for the backside of a semiconductor is in the form of a laminated film of the resin layer and the coloring agent layer, the film 2 for the backside of a semiconductor preferably has a laminated state of a resin layer/a coloring agent layer/a resin layer. In this case, the two resin layers on both sides of the coloring agent layer may be resin layers having the same composition or may be resin layers having different compositions.

Other additives can be appropriately compounded in the film 2 for the backside of a semiconductor as necessary. Examples of the other additives include a flame retardant, a silane coupling agent, an ion trapping agent, an extender, an anti-aging agent, an antioxidant, and a surfactant.

Examples of the flame retardant include antimony trioxide, antimony pentoxide, and a brominated epoxy resin. These can be used alone or two types or more can be used together. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These compounds can be used alone or two types or more can be used together. Examples of the ion trap agent include hydrotalcites and bismuth hydroxide. These can be used alone or two types or more can be used together.

The film 2 for the backside of a semiconductor can be formed by a common method of mixing a thermosetting resin such as an epoxy resin, optionally a thermoplastic resin such as an acrylic resin, and optionally a solvent, other additives, and the like to prepare a resin composition and forming the composition into a film layer. Specifically, a film layer (an adhesive layer) as the film for the backside of a semiconductor can be formed by a method of applying the resin composition onto the pressure-sensitive adhesive layer 32 of the dicing tape, a method of applying the resin composition onto an appropriate separator such as release paper to form a resin layer (or an adhesive layer) and transcribing (transferring) the resin layer onto the pressure-sensitive adhesive layer 32, or the like. The resin composition may be a solution or a dispersion liquid.

When the film 2 for the backside of a semiconductor is formed of a resin composition containing a thermosetting resin such as an epoxy resin, the thermosetting resin in the film for the backside of a semiconductor is uncured or is partially cured at the stage before application to a semiconductor wafer. In this case, the thermosetting resin in the film for the backside of a semiconductor is completely cured or almost completely cured after application to a semiconductor wafer (normally when curing a sealing material in a flip-chip bonding step).

Even if the film for the backside of a semiconductor contains the thermosetting resin, since the thermosetting resin is uncured or is partially cured, the gel fraction of the film for the backside of a semiconductor is not especially limited. The gel fraction can be appropriately selected from a range of 50% by weight or less (0 to 50% by weight), preferably 30% by weight or less (0 to 30% by weight), and especially preferably 10% by weight or less (0 to 10% by weight). The gel fraction of the film for the backside of a semiconductor can be measured by the following method.

<Method of Measuring Gel Fraction>

About 0.1 g of a sample (sample weight) is precisely weighed from the film for the backside of a semiconductor, the sample is wrapped with a mesh sheet, and then the sample is immersed in about 50 ml of toluene at room temperature for a week. After that, the portion insoluble in the solvent (content of the mesh sheet) is taken out of toluene and dried at 130° C. for about 2 hours, and after drying, the portion insoluble in the solvent is weighed (weight after immersion and drying), and the gel fraction (% by weight) is calculated from the following formula (a).

$$\text{Gel fraction (\% by weight)} = [(\text{Weight after immersion and drying})/(\text{Sample weight})] \times 100 \quad (a)$$

The gel fraction of the film for the backside of a semiconductor can be controlled by the type and the content of the resin component, the type and the content of the cross-linking agent, the heating temperature, the heating time, and the like.

When the film for the backside of a semiconductor in the present invention is a film that is formed with a resin composition containing a thermosetting resin such as an epoxy resin, adhesion to a semiconductor wafer can be exhibited effectively.

Because cutting water is used in the dicing step of the semiconductor wafer, the film for the backside of a semiconductor may absorb moisture and the water content may exceed the normal value. When flip-chip bonding is performed with such a high water content, water vapor is accumulated in the boundary between the film 2 for the backside of a semiconductor and a semiconductor wafer or a processed body thereof (a semiconductor), and floating may occur. Therefore, to avoid such a problem, the film for the backside of a semiconductor is made to have a configuration in which a core material having high moisture permeability is provided on both surfaces thereof to diffuse water vapor. From such a viewpoint, a multilayered structure in which films 2 and 12 for the backside of a semiconductor are formed on one surface or both surfaces of the core material may be used as the film for the backside of a semiconductor. Examples of the core material include a film such as a polyimide film, a polyester film, a polyethylene terephthalate film, a polyethylene naphthalate film, or a polycarbonate film, a resin substrate reinforced by a glass fiber or a plastic nonwoven fiber, a silicon substrate, or a glass substrate.

The thickness of the film 2 for the backside of a semiconductor is not especially limited. However, the thickness can be appropriately selected from a range of about 2 to 200 μm. The thickness is preferably about 4 to 160 μm, more preferably about 6 to 100 μm, and especially preferably about 10 to 80 μm.

The tensile storage elastic modulus at 23° C. of the film 2 for the backside of a semiconductor in an uncured state is preferably in the range of 1.0 GPa to 3.0 GPa, and more preferably in the range of 1.2 GPa to 2.9 GPa. If the tensile storage elastic modulus at 23° C. of the film 2 for the backside of a semiconductor in an uncured state is 1.0 to 3.0 GPa, the warpage of the semiconductor chip can be suppressed. Because the tackiness can also be suppressed, the adhesion of a semiconductor chip to a suction collet or the like can be suppressed when the semiconductor chip is mounted. The tensile storage elastic modulus (23° C.) of the film for the backside of a semiconductor in an uncured state can be controlled by the type and the content of the resin components (thermoplastic resin and thermosetting resin), the type and the content of the filler such as a silica filler, or the like. Especially, the tensile storage elastic modulus can be controlled by the content of the acrylic resin.

The uncured film 2 for the backside of a semiconductor was produced without laminating the films on the dicing tape 3, and the tensile storage modulus was measured using a dynamic viscoelasticity measurement apparatus (Solid Analyzer RS A2) manufactured by Rheometric Scientific FE, Ltd. in tensile mode, sample width 10 mm, sample length 22.5 mm, sample thickness 0.2 mm, frequency 1 Hz, temperature rise rate 10° C./min, under a nitrogen atmosphere, and at a prescribed temperature (23° C.).

At least one of the surfaces of the film 2 for the backside of a semiconductor is preferably protected by a separator (a release liner, not shown in the drawings). In a case of a film 1 for the backside of a semiconductor integrated with a dicing tape, the separator may be provided only on one surface of the film for the backside of a semiconductor. On the other hand, in the case of a film for the backside of a semiconductor that is not integrated with the dicing tape, the separator may be provided on one surface or both surfaces of the film for the backside of a semiconductor. The separator has a function of protecting the film for the backside of a semiconductor as a protective material until the film is used. In the case of the film 1 for the backside of a semiconductor integrated with a dicing tape, the separator can be further used as a support base when transferring the film 2 for the backside of a semiconductor to the pressure-sensitive adhesive layer 32 on the base of the dicing tape. The separator is peeled when pasting the semiconductor wafer onto the film for the backside of a semiconductor. Examples of the separator include polyethylene, polypropylene, a plastic film such as polyethylene terephthalate whose surface is coated with a release agent such as a fluorine release agent or a long chain alkylacrylate release agent, and paper. The separator can be formed by a conventionally known method. The thickness of the separator is also not especially limited.

When the film 2 for the backside of a semiconductor are not laminated on the dicing tape 3, the film 2 for the backside of a semiconductor may be protected by the separator having a release layer on both surfaces in a form of being wound up in a roll using one sheet of the separator, or may be protected by a separator having a release layer on at least on one of the surfaces.

The light transmittance (visible light transmittance) of visible light (having a wavelength of 400 to 800 nm) in the film 2 for the backside of a semiconductor is not especially limited, and is preferably in a range of 20% or less (0 to 20%), more preferably 10% or less (0 to 10%), and especially preferably 5% or less (0 to 5%). When the visible light transmittance of the film 2 for the backside of a semiconductor is larger than 20%, there is a fear that a bad influence may be given to the semiconductor element when the light beam passes. The visible light transmittance (%) can be controlled by the type and the content of the resin component of the film 2 for the backside of a semiconductor, the type and the content of the coloring agent such as a pigment or a dye, the content of the inorganic filler, and the like.

The visible light transmittance (%) of the film 2 for the backside of a semiconductor can be measured as follows. That is, the film 2 for the backside of a semiconductor having a thickness (average thickness) of 20 µm is produced. The film 2 for the backside of a semiconductor is then irradiated with visible light having a wavelength of 400 to 800 nm (a visible light generator "Absorption Spectro Photometer" manufactured by Shimadzu Corporation) at a prescribed intensity, and the intensity of the transmitted visible light beam is measured. The visible light transmittance can be obtained from a change of the intensity before and after the visible light beam transmits through the film 2 for the backside of a semiconductor. It is also possible to obtain the visible light transmittance (%; wavelength: 400 to 800 nm) of the film 2 for the backside of a semiconductor having a thickness of 20 µm from the visible light transmittance (%; wavelength: 400 to 800 nm) of the film 2 for the backside of a semiconductor whose thickness is not 20 µm. The visible light transmittance (%) of the film 2 for the backside of a semiconductor having a thickness of 20 µm is obtained in the present invention. However, the thickness of the film for the backside of a semiconductor according to the present invention is not limited to 20 µm.

The coefficient of moisture absorption of the film 2 for the backside of a semiconductor is preferably low. Specifically, the coefficient of moisture absorption is preferably 1% by weight or less, and more preferably 0.8% by weight or less. By making the coefficient of moisture absorption 1% by weight or less, the laser marking property can be improved. Further, generation of voids between the film 2 for the backside of a semiconductor and the semiconductor element can be suppressed or prevented in a reflow step, for example. The coefficient of moisture absorption is a value calculated from the weight change before and after the film 2 for the backside of a semiconductor are left under an atmosphere of a temperature of 85° C. and a relative humidity of 85% RH for 168 hours. When the film 2 for the backside of a semiconductor are formed of a resin composition containing a thermosetting resin, the coefficient of moisture absorption is a value obtained the films for the backside of a semiconductor after thermal curing are left under an atmosphere of a temperature of 85° C. and a relative humidity of 85% RH for 168 hours. The coefficient of moisture absorption can be adjusted by changing the added amount of the inorganic filler, for example.

The ratio of the volatile component of the film 2 for the backside of a semiconductor is preferably small. Specifically, the weight decrease rate (ratio of the weight decrease amount) of the film 2 for the backside of a semiconductor after a heat treatment is preferably 1% by weight or less, and more preferably 0.8% by weight or less. The condition of the heating treatment is a heating temperature of 250° C. and a heating time of 1 hour, for example. By making the weight decrease rate 1% by weight or less, the laser marking property can be improved. The generation of cracks in the flip-chip type semiconductor device can be suppressed or prevented in a reflow step, for example. The weight decrease rate can be adjusted by adding an inorganic substance that can decrease the generation of cracks during a lead free solder reflow, for example. When the film 2 for the backside of a semiconductor is formed with a resin composition containing a thermosetting resin, the weight decrease rate means a value obtained when the film for the backside of a semiconductor after thermal curing is heated under conditions of a heating temperature of 250° C. and a heating time of 1 hour.

(Dicing Tape)

The dicing tape 3 as a configuration in which the pressure-sensitive adhesive 32 is formed on the base 31. As described above, the dicing tape 3 may have a configuration in which the base 31 and the pressure-sensitive adhesive layer 32 are laminated. The base (support base) can be used as a support base body of the pressure-sensitive adhesive layer, and the like. The base 31 preferably has radiation transparency. Examples of the base 31 include appropriate thin materials including paper bases such as paper; fiber bases such as cloth, unwoven cloth, felt, and net; metal bases such as a metal foil and a metal plate; plastic bases such as a plastic film and sheet; rubber bases such as a rubber sheet; foams such as a foamed sheet, and laminated bodies of these (especially laminated bodies of a plastic base and other bases and laminated bodies of plastic films or sheets). In the present invention, a plastic base such as a plastic film or sheet can be preferably used as the base. Examples of the material of such a plastic base include olefin resins such as polyethylene (PE), polypropylene (PP), and an ethylene-propylene copolymer; copolymers having ethylene as a monomer component such as a ethylene vinyl acetate copolymer (EVA), an ionomer resin, a ethylene-(meth)acrylate copolymer, and an ethylene-(meth)acrylate (random, alternating) copolymer; polyesters such as polyethylene terephthalate (PET), polyethylene naphthalate (PEN), and polybutylene terephthalate (PBT); an acrylic resin; polyvinyl chloride (PVC); polyurethane; polycarbonate; polyphenylene sulfide (PPS); amide resins such as polyamide (nylon) and fully aromatic polyamide (aramid); polyether ether ketone (PEEK); polyimide; polyetherimide; polyvinylidene chloride; ABS (acrylonitrile-butadiene-styrene copolymer); a cellulose resin; a silicone resin; and a fluororesin.

Further, the material of the base 31 includes a polymer such as a cross-linked body of the above resins. The above plastic film may be also used unstreched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 32 and the film 2 for the backside of a semiconductor are reduced by thermally shrinking the base 31 after dicing, and the recovery of the semiconductor chips (a semiconductor element) can be facilitated.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the base 31 in order to improve adhesiveness, holding properties, etc. with the adjacent layer.

The same type or different types can be appropriately selected and used as the base 31, and several types can be blended and used as necessary. A vapor deposited layer of a conductive substance having a thickness of about 30 to 500 Å consisting of metals, alloys, and oxides of these can be provided on the base 31 to give an antistatic function to the base 31. The base 31 may be a single layer or a multilayer consisting of two types or more layers.

The thickness of the base 31 (total thickness in the case of a laminated body) is not especially limited, and can be appropriately selected according to the strength, flexibility, purpose of use, and the like. For example, the thickness is generally 1000 μm or less (1 to 1000 μm, for example), preferably 10 to 500 μm, more preferably 20 to 300 μm, and especially preferably about 30 to 200 μm. However, the thickness is not limited to these ranges.

The base 31 may contain various additives such as a coloring agent, a filler, a plasticizer, an anti-aging agent, an antioxidant, a surfactant, and a flame retardant as long as the effects of the present invention are not deteriorated.

The pressure-sensitive adhesive layer 32 is formed with a pressure-sensitive adhesive, and has adherability. The pressure-sensitive adhesive is not especially limited, and can be appropriately selected among known pressure-sensitive adhesives. Specifically, known pressure-sensitive adhesives (refer to Japanese Patent Application Laid-Open Nos. 56-61468, 61-174857, 63-17981, and 56-13040, for example) such as a pressure-sensitive adhesive having the above-described characteristics can be appropriately selected from an acrylic pressure-sensitive adhesive, a rubber pressure-sensitive adhesive, a vinylalkylether pressure-sensitive adhesive, a silicone pressure-sensitive adhesive, a polyester pressure-sensitive adhesive, a polyamide pressure-sensitive adhesive, a urethane pressure-sensitive adhesive, a fluorine pressure-sensitive adhesive, a styrene-diene block copolymer pressure-sensitive adhesive, and a creep property improved pressure-sensitive adhesive in which a hot-melt resin having a melting point of about 200° C. or less is compounded in these pressure-sensitive adhesives. A radiation curing type pressure-sensitive adhesive (or an energy ray curing type pressure-sensitive adhesive) and a thermally expandable pressure-sensitive adhesive can also be used as the pressure-sensitive adhesive. The pressure-sensitive adhesives can be used alone or two types or more can be used together.

An acrylic pressure-sensitive adhesive and a rubber pressure-sensitive adhesive can be suitably used as the pressure-sensitive adhesive, and especially an acrylic pressure-sensitive adhesive is suitable. An example of the acrylic pressure-sensitive adhesive is an acrylic pressure-sensitive adhesive having an acrylic polymer, in which one type or two types or more of alkyl(meth)acrylates are used as a monomer component, as a base polymer.

Examples of alkyl(meth)acrylates in the acrylic pressure-sensitive adhesive include methyl(meth)acrylate, ethyl(meth)acrylate, propyl(meth)acrylate, isopropyl(meth)acrylate, butyl(meth)acrylate, isobutyl(meth)acrylate, s-butyl(meth)acrylate, t-butyl(meth)acrylate, pentyl(meth)acrylate, hexyl(meth)acrylate, heptyl(meth)acrylate, octyl(meth)acrylate, 2-ethylhexyl(meth)acrylate, isooctyl(meth)acrylate, nonyl(meth)acrylate, isononyl(meth)acrylate, decyl(meth)acrylate, isodecyl(meth)acrylate, undecyl(met)acrylate, dodecyl(meth)acrylate, tridecyl(meth)acrylate, tetradecyl(meth)acrylate, pentadecyl(meth)acrylate, hexadecyl(meth)acrylate, heptadecyl(meth)acrylate, octadecyl(meth)acrylate, nonadecyl(meth)acrylate, and eicosyl(meth)acrylate. Alkyl(meth)acrylates having an alkyl group of 4 to 18 carbon atoms is suitable. The alkyl group of alkyl(meth)acrylates may be any of linear or branched chain.

The acrylic polymer may contain units that correspond to other monomer components that is copolymerizable with alkyl(meth)acrylates described above (copolymerizable monomer component) for reforming cohesive strength, heat resistance, and crosslinking property, as necessary. Examples of such copolymerizable monomer components include carboxyl group-containing monomers such as (meth)acrylic acid (acrylic acid, methacrylic acid), carboxyethyl acrylate, carboxypentyl acrylate, itaconic acid, maleic acid, fumaric acid, and crotonic acid; acid anhydride group-containing monomers such as maleic anhydride and itaconic anhydride; hydroxyl group-containing monomers such as hydroxyethyl(meth)acrylate, hydroxypropyl(meth)acrylate, hydroxybutyl(meth)acrylate, hydroxyhexyl(meth)acrylate, hydroxyoctyl(meth)acrylate, hydroxydecyl(meth)acrylate, hydroxylauryl(meth)acrylate, and (4-hydroxymethylcyclohexyl)methyl methacrylate; sulfonate group-containing monomers such as styrenesulfonic acid, allylsulfonic acid, 2-(meth)acrylamide-2-methylpropanesulfonic acid, (meth)acrylamidepropanesulfonic acid, sulfopropyl(meth)acrylate, and (meth)acryloyloxynaphthalenesulfonic acid; phosphate group-containing monomers such as 2-hydroxyethylacryloylphosphate; (N-substituted)amide monomers such as (meth)acrylamide, N,N-dimethyl(meth)acrylamide, N-butyl(meth)acrylamide, N-methylol(meth)acrylamide, and N-methylolpropane(meth)acrylamide; aminoalkyl(meth)acrylate monomers such as aminoethyl(meth)acrylate, N,N- dimethylaminoethyl(meth)acrylate, and t-butylaminoethyl (meth)acrylate; alkoxyalkyl(meth)acrylate monomers such as methoxyethyl(meth)acrylate and ethoxyethyl(meth)acrylate; cyanoacrylate monomers such as acrylonitrile and methacrylonitrile; epoxy group-containing acrylic monomers such as glycidyl(meth)acrylate; styrene monomers such as styrene and α-methylstyrene; vinylester monomers such as vinyl acetate and vinyl propionate; olefin monomers such as isoprene, butadiene, and isobutylene; vinylether monomers such as vinylether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxylic acid amides, and N-vinylcaprolactam; maleimide monomers such as N-cyclohexylmaleimide, N-isopropylmaleimide, N-laurylmaleimide, and N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide monomers such as N-(meth)acryloyloxymethylene succinimide, N-(meth)acryloyl-6-oxyhexamethylene succinimide, and N-(meth)acryloyl-8-oxyoctamethylene succinimide; glycol acrylester monomers such as polyethylene glycol(meth)acrylate, polypropylene glycol(meth)acrylate, metoxyethylene glycol(meth)acrylate, and metoxypolypropylene glycol(meth)acrylate; acrylate monomers having a heterocyclic ring, a halogen atom, a silicon atom, and the like such as tetrahydrofurfuryl(meth)acrylate, fluorine(meth)acrylate, and silicone(meth)acrylate; and polyfunctional monomers such as hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri (meth)acrylate, pentaerythritol tri(meth)acrylate, dipentaerythritol hexa(meth)acrylate, epoxyacrylate, polyesteracrylate, urethaneacrylate, divinylbenzene, butyl di(meth) acrylate, and hexyl di(meth)acrylate. One type or two types or more of these copolymerizable monomer components can be used.

When a radiation curing type pressure-sensitive adhesive (or an energy ray curing type pressure-sensitive adhesive) is used as the pressure-sensitive adhesive, examples of the radiation curing type pressure-sensitive adhesive (composition) include an internal radiation curing type pressure-sensitive adhesive having a polymer with a radical reactive carbon-carbon double bond in the polymer side chain, the main chain, or the ends of the main chain as a base polymer and a radiation curing type pressure-sensitive adhesive in which ultraviolet-ray curing-type monomer component and oligomer component are compounded in the pressure-sensitive adhesive. When a thermally expandable pressure-sensitive adhesive is used as the pressure-sensitive adhesive, examples thereof include a thermally expandable pressure-sensitive adhesive containing a pressure-sensitive adhesive and a foaming agent (especially, a thermally expandable microsphere).

The pressure-sensitive adhesive layer 32 of the present invention may contain various additives such as a tackifier, a coloring agent, a thickener, an extender, a filler, a plasticizer, an anti-aging agent, an antioxidant, a surfactant, and a crosslinking agent as long as the effects of the present invention are not deteriorated.

The crosslinking agent is not especially limited, and known crosslinking agents can be used. Specific examples of the crosslinking agent include an isocyanate crosslinking agent, an epoxy crosslinking agent, a melamine crosslinking agent, a peroxide crosslinking agent, a urea crosslinking agent, a metal alkoxide crosslinking agent, a metal chelate crosslinking agent, a metal salt crosslinking agent, a carbodiimide crosslinking agent, an oxazoline crosslinking agent, an aziridine crosslinking agent, and an amine crosslinking agent, and an isocyanate crosslinking agent and an epoxy crosslinking agent are preferable. The crosslinking agents can be used alone or two types or more can be used together. The used amount of the crosslinking agent is not especially limited.

Examples of the isocyanate crosslinking agent include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylene diisocyanate; and aromatic polyisocyanates such as 2,4-tolylene diisocyanate, 2,6-tolylene diisocyanate, 4,4'-diphenylmethane diisocyanate, and xylylene diisocyanate. A trimethylolpropane/tolylene diisocyanate trimeric adduct (Coronate L manufactured by Nippon Polyurethane Industry Co., Ltd.), and a trimethylolpropane/ hexamethylene diisocyanate trimeric adduct (Coronate HL manufactured by Nippon Polyurethane Industry Co., Ltd.) can also be used. Examples of the epoxy crosslinking agent include N,N,N',N'-tetraglycidyl-m-xylenediamine, diglycidylaniline, 1,3-bis(N,N-glycidylaminomethyl)cyclohexane, 1,6-hexanediol diglycidylether, neopentylglycol diglycidylether, ethyleneglycol diglycidylether, propyleneglycol diglycidylether, polyethyleneglycol diglycidylether, polypropyleneglycol diglycidylether, sorbitol polyglycidylether, glycerol polyglycidylether, pentaerythritol polyglycidylether, polyglycerol polyglycidylether, sorbitan polyglycidylether, trimethylolpropane polyglycidylether, diglycidyl adipate, o-diglycidyl phthalate, triglycidyl-tris(2-hydroxyethyl)isocyanurate, resorcin diglycidylether, bisphenol-S-diglycidylether; and an epoxy resin having two or more epoxy groups in a molecule.

In the present invention, a crosslinking treatment can be performed by irradiation with an electron beam, an ultraviolet ray, or the like instead of using the crosslinking agent or in addition to the use of the crosslinking agent.

The pressure-sensitive adhesive layer 32 can be formed by a common method of forming a sheet-like layer by mixing the pressure-sensitive adhesive with a solvent, other additives, and the like as necessary. Specifically, the pressure-sensitive adhesive layer 32 can be produced by a method of applying the pressure-sensitive adhesive or a mixture containing the pressure-sensitive adhesive, a solvent and other additives to the base 31, a method of forming the pressure-sensitive adhesive layer 32 by applying the above-described mixture to an appropriate separator (release paper, for example), and transferring (adhering) the resultant onto the base 31, for example.

The thickness of the pressure-sensitive adhesive layer 32 is not especially limited, and is about 5 to 300 μm (preferably 5 to 200 μm, more preferably 5 to 100 μm, and especially preferably 7 to 50 μm). When the thickness of the pressure-sensitive adhesive layer 32 is in the above-described range, adequate adhesive power can be exhibited. The pressure-sensitive adhesive layer 32 may be a single layer or a plurality of layers.

The adhering strength (23° C., peeling angle 180°, peeling speed 300 mm/min) of the pressure-sensitive adhesive layer 32 of the dicing tape 3 to the film 2 for the backside of a flip-chip semiconductor is preferably in a range of 0.02 N/20 mm to 10 N/20 mm, and more preferably 0.05 N/20 mm to 5 N/20 mm. By making the adhering strength 0.02 N/20 mm or more, chip flying of a semiconductor element can be prevented when dicing the semiconductor wafer. Meanwhile, by making the adhering strength 10 N/20 mm or less, difficulty in peeling the semiconductor element off and generation of adhesive residue can be prevented when picking the semiconductor element up.

In the present invention, an antistatic function can be given to the film 2 for the backside of a flip-chip type semiconductor and the film 1 for the backside of a semiconductor integrated with a dicing tape. With this configuration, generation of static electricity on the films during adhesion and peeling and damages of the circuit due to electrification of the semiconductor wafer, and the like can be prevented. The antistatic function can be given by an appropriate method such as a method of adding an antistatic agent or a conductive substance to the base 31, the pressure-sensitive adhesive layer 32, or the film 2 for the backside of a flip-chip type semiconductor and a method of providing a conductive layer made of a charge-transfer complex or a metal film to the base 31. A method of giving the antistatic function is preferable with which impurity ions that can deteriorate the semiconductor wafer are hardly generated.

The film 2 for the backside of a flip-chip type semiconductor and film 1 for the backside of a semiconductor integrated with a dicing tape may be formed in a form in which the films are wound into a roll or a form in which the films are laminated. When the film have a form in which they are wound into a roll, the film 2 for the backside of a flip-chip type semiconductor or a film 1 for the backside of a semiconductor integrated with a dicing tape having a form in which the films are wound into a roll can be produced by winding the film 2 for the backside of a flip-chip type semiconductor or a laminated body of the film 2 for the backside of a flip-chip type semiconductor and the dicing tape 3 into a roll while protecting the film or the laminated body with a separator as necessary. The film 1 for the backside of a semiconductor integrated with a dicing tape that is wound into a roll may be configured with the base 31, the pressure-sensitive adhesive layer 32 that is formed on one side of the base 31, a film for the backside of a semiconductor that is formed on the pressure-sensitive adhesive layer 32, and a release treatment layer (a back treatment layer) that is formed on the other surface of the base 31.

The thickness (total thickness of the thickness of the film for the backside of a semiconductor and the thickness of the dicing tape made of the base 31 and the pressure-sensitive adhesive layer 32) of the film 1 for the backside of a semiconductor integrated with a dicing tape can be selected from a range of 8 to 1500 μm, preferably 20 to 850 μm, more preferably 31 to 500 μm, and especially preferably 47 to 330 μm.

By controlling the ratio between the thickness of the film 2 for the backside of a flip-chip type semiconductor and the thickness of the pressure-sensitive adhesive layer 32 of the dicing tape 3 and the ratio between the thickness of the film 2 for the backside of a flip-chip type semiconductor and the thickness of the dicing tape 3 (total thickness of the base 31 and the pressure-sensitive adhesive layer 32) in the film 1 for the backside of a semiconductor integrated with a dicing tape, the dicing property in a dicing step, the pickup property in a pickup step, and the like can be improved, and the film 1 for the backside of a semiconductor integrated with a dicing tape can be effectively used from the dicing step of a semiconductor wafer to the flip-chip bonding step of a semiconductor chip.

(Method of Manufacturing Film for the Backside of a Semiconductor Integrated with a Dicing Tape)

A method of manufacturing the film for the backside of a semiconductor integrated with a dicing tape according to this embodiment is explained using the film 1 for the backside of a semiconductor integrated with a dicing tape shown in FIG. 1 as an example. First, the base 31 can be formed by a conventionally known film forming method. Examples of the film forming method include a calender film forming method, a casting method in an organic solvent, an inflation extrusion method in a closed system, a T die extrusion method, a co-extrusion method, and a dry laminating method.

The pressure-sensitive adhesive layer 32 is formed by applying a pressure-sensitive adhesive composition to the base 31 and drying the composition (by crosslinking by heat as necessary). Examples of the application method include roll coating, screen coating, and gravure coating. The pressure-sensitive adhesive layer 32 may be formed on the base 31 by applying the pressure-sensitive adhesive composition directly to the base 31, or the pressure-sensitive adhesive layer 32 may be transferred to the base 31 after the pressure-sensitive adhesive layer 32 is formed by applying the pressure-sensitive adhesive composition to a release paper whose surface has been subjected to a release treatment. With this configuration, the dicing tape 3 is produced in which the pressure-sensitive adhesive layer 32 is formed on the base 31.

The material for forming the film 2 for the backside of a semiconductor is applied onto release paper to have a prescribed thickness after drying, and further dried under a prescribed condition (a heat treatment is performed as necessary to dry the material when thermal curing is necessary) to forma coating layer. The coating layer is transcribed onto the pressure-sensitive adhesive layer 3 to form the film 2 for the backside of a semiconductor on the pressure-sensitive adhesive layer 32. The material for forming the film 2 for the backside of a semiconductor can be directly applied onto the pressure-sensitive adhesive layer 32 and dried under a prescribed condition (a heat treatment is performed as necessary to dry the material when thermal curing is necessary) to form the film 2 for the backside of a semiconductor on the pressure-sensitive adhesive layer 32. With the above, the film 1 for the backside of a semiconductor integrated with a dicing tape according to the present invention can be obtained. When thermal curing is performed to form the film 2 for the backside of a semiconductor, it is important to perform thermal curing up to a level at which the film is partially cured. However, it is preferable not to perform thermal curing.

The film 1 for the backside of a semiconductor integrated with a dicing tape of the present invention can be used suitably in the manufacture of a semiconductor device having a flip-chip bonding step. The film 1 for the backside of a semiconductor integrated with a dicing tape of the present invention is used to manufacture a flip-chip mounted semiconductor device, and the flip-chip mounted semiconductor device is manufactured in a form in which the film 2 for the backside of a semiconductor of the film 1 for the backside of a semiconductor integrated with a dicing tape is pasted to the backside of the semiconductor chip. Therefore, the film 1 for the backside of a semiconductor integrated with a dicing tape of the present invention can be used for a flip-chip mounted semiconductor device (a semiconductor device in a form in which the semiconductor chip is fixed to an adherend such as a substrate by a flip-chip bonding method).

The film 2 for the backside of a semiconductor can be used for a flip-chip mounted semiconductor device (a semiconductor device having a form in which the semiconductor chip is fixed to an adherend such as a substrate by a flip-chip bonding method) similarly to the film 1 for the backside of a semiconductor integrated with a dicing tape.
(Semiconductor Wafer)

The semiconductor wafer is not especially limited as long as it is a known or common semiconductor wafer, and semiconductor wafers made of various materials can be appropriately selected and used. In the present invention, a silicon wafer can be suitably used as the semiconductor wafer.
(Method of Manufacturing Semiconductor Device)

In the following, the method of manufacturing a semiconductor device according to this embodiment is explained by referring to FIG. 2. FIG. 2 is a sectional schematic drawing showing a method of manufacturing a semiconductor device using the film 1 for the backside of a semiconductor integrated with a dicing tape.

In the method of manufacturing a semiconductor device, a semiconductor device can be manufactured using the film 1 for the backside of a semiconductor integrated with a dicing tape. Specifically, the method includes at least a step of pasting a semiconductor wafer onto the film for the backside of a semiconductor integrated with a dicing tape, a step of dicing the semiconductor wafer, a step of picking up a semiconductor element that is obtained by dicing, and a step of flip-chip bonding the semiconductor element onto an adherend.

In case of the film 2 for the backside of a semiconductor, a semiconductor device can be manufactured by a method following a method of manufacturing a semiconductor device using the film 1 for the backside of a semiconductor integrated with a dicing tape. For example, a semiconductor device can be manufactured by pasting the film 2 for the backside of a semiconductor and a dicing tape together and using the resultant as the film for the backside of a semiconductor integrated with a dicing tape in which the film 2 is integrated with the dicing tape. In this case, the method of manufacturing a semiconductor device using the film 2 for the backside of a semiconductor is a manufacturing method including a step of pasting the film for the backside of a semiconductor and a dicing tape together so that the film for the backside of a semiconductor and the pressure-sensitive adhesive layer of the dicing tape come into contact with each other in addition to the steps of the method of manufacturing the film for the backside of a semiconductor integrated with a dicing tape.

The film 2 for the backside of a semiconductor may be used by pasting to a semiconductor wafer without integrating with the dicing tape. In this case, a step of pasting a semiconductor wafer onto the film for the backside of a semiconductor integrated with a dicing tape in the method of manufacturing the film for the backside of a semiconductor integrated with a dicing tape is a step of pasting the film for the backside of a semiconductor to a semiconductor wafer and a step of pasting the dicing tape to the film for the backside of a semiconductor that is pasted to the semiconductor wafer so that the film for the backside of a semiconductor and the pressure-sensitive adhesive layer of the dicing tape come into contact with each other in the method of manufacturing a semiconductor device using the film 2 for the backside of a semiconductor.

The film 2 for the backside of a semiconductor can be used by pasting the semiconductor wafer to an individual semiconductor chip. In this case, the method of manufacturing a semiconductor device using the film 2 for the backside of a semiconductor may include at least a step of pasting a dicing tape to a semiconductor wafer, a step of dicing the semiconductor wafer, a step of picking up the semiconductor element that is obtained by dicing, a step of flip-chip bonding the semiconductor element to an adherend, and a step of pasting a film for the backside of a semiconductor to the semiconductor element.
[Mounting Step]

Figure 2A:
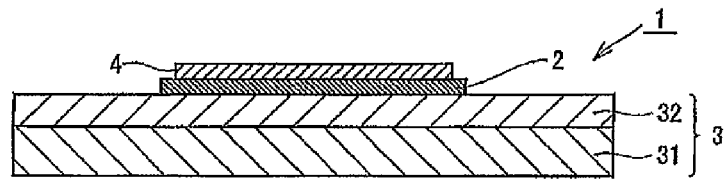
FIGS. 2(a) to 2(d) are schematic cross-sectional views showing one example of the method of manufacturing a semiconductor device using the film for the backside of a semiconductor integrated with a dicing tape according to one embodiment of the present invention.

As shown in FIG. 2(a), the separator that is appropriately provided on the film 2 for the backside of a semiconductor of the film 1 for the backside of a semiconductor integrated with a dicing tape is appropriately peeled off, a semiconductor wafer 4 is pasted to the film 2 for the backside of a semiconductor, and the laminate is fixed by adhering and holding (a mounting step). At this time, the film 2 for the backside of a semiconductor is uncured (including a condition of being partially cured). The film 1 for the backside of a semiconductor integrated with a dicing tape is pasted to the backside of the semiconductor wafer 4. The backside of the semiconductor wafer 4 means the surface opposite to the circuit surface (also referred to as a non-circuit surface or a non-electrode forming surface). The pasting method is not especially limited, and a pasting method by pressure-bonding is preferable. The pressure-bonding is performed by pressing by a pressing means such as a press roll.
[Dicing Step]

Figure 2B:
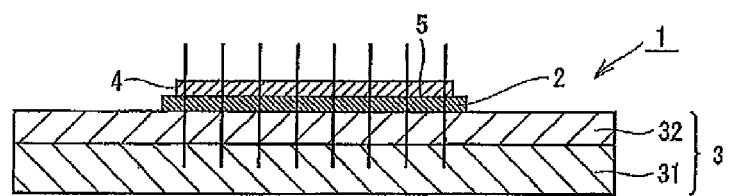

As shown in FIG. 2(b), dicing of the semiconductor wafer 4 is performed. With this operation, the semiconductor wafer 4 is cut into individual pieces (cut into small pieces) having a prescribed size, and a semiconductor chip 5 is manufactured. The dicing is performed from the circuit surface side of the semiconductor wafer 4 by a normal method, for example. For example, a cutting method called full cut in which cutting is performed up to the film 1 for the backside of a semiconductor integrated with a dicing tape can be adopted in this step. The dicing apparatus used in this step is not especially limited, and a conventionally known apparatus can be used. Because the semiconductor wafer 4 is adhered and fixed with excellent adhesion by the film 1 for the backside of a semiconductor integrated with a dicing tape having the film for the backside of a semiconductor, chip cracks and chip fly can be suppressed and damages to the semiconductor wafer 4 can also be suppressed. When the film 2 for the backside of a semiconductor is formed of a resin composition containing an epoxy resin, the occurrence of protrusion of the adhesive layer of the film for the backside of a semiconductor at a surface cut by dicing can be suppressed or prevented. As a result, reattachment (blocking) of the cut surfaces can be suppressed or prevented, and pickup described later can be performed more favorably.

When expanding the film 1 for the backside of a semiconductor integrated with a dicing tape, a conventionally known expanding apparatus can be used. The expanding apparatus has a donut-shaped outer ring that can push down the film 1 for the backside of a semiconductor integrated with a dicing tape through a dicing ring and an inner ring that has a smaller diameter than the outer ring and that supports the film for the backside of a semiconductor integrated with a dicing tape. With this expanding step, generation of damages caused by the contact between adjacent semiconductor chips can be prevented in the pickup step described later.
[Pickup Step]

Figure 2C:
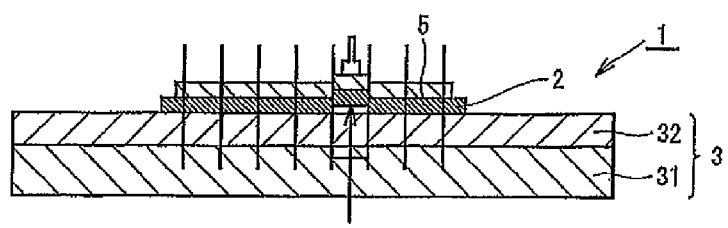

The semiconductor chip 5 is peeled from the dicing tape 3 together with the film 2 for the backside of a semiconductor by performing pickup of the semiconductor chip 5 as shown in FIG. 2(c) to collect the semiconductor chip 5 that is adhered and fixed to the film 1 for the backside of a semiconductor integrated with a dicing tape. The pickup method is not especially limited, and various conventionally known methods can be adopted. An example of the method is a method of pushing up an individual semiconductor chip 5 from the side of the base 31 of the film 1 for the backside of a semiconductor integrated with a dicing tape with a needle and picking up the pushed semiconductor chip 5 with a pickup apparatus. The backside of the semiconductor chip 5 that is picked up is protected by the film 2 for the backside of a semiconductor.

[Flip-Chip Bonding Step]

Figure 2D:
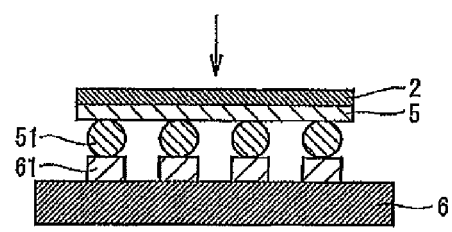

As shown in FIG. 2(d), the semiconductor chip 5 that is picked up is fixed to an adherend such as a substrate by a flip-chip bonding method (flip-chip mounting method). Specifically, the semiconductor chip 5 is fixed to an adherend 6 by a normal method in a form that the circuit surface (also referred to as the surface, a circuit pattern forming surface, or an electrode forming surface) of the semiconductor chip 5 faces the adherend 6. The semiconductor chip 5 can be fixed to the adherend 6 while securing electrical conduction of the semiconductor chip 5 with the adherend 6 by contacting and pressing a bump 51 formed on the circuit surface side of the semiconductor chip 5 to a conductive material 61 such as solder for bonding that is adhered to a connection pad of the adherend 6 and melting the conductive material (a flip-chip bonding step). At this time, a space is formed between the semiconductor chip 5 and the adherend 6, and the distance of the space is generally about 30 to 300 µm. After flip-chip bonding (flip-chip connection) of the semiconductor chip 5 onto the adherend 6, it is important to wash the facing surface and the space between the semiconductor chip 5 to the adherend 6 and to seal the space by filling the space with a sealing material such as a sealing resin.

Various substrates such as a lead frame and a circuit board (a wiring circuit board, for example) can be used as the adherend 6. The material of the substrate is not especially limited, and examples thereof include a ceramic substrate and a plastic substrate. Examples of the plastic substrate include an epoxy substrate, a bismaleimide triazine substrate, and a polyimide substrate.

The material of the bump and the conductive material in the flip-chip bonding step are not especially limited, and examples thereof include solders (alloys) of a tin-lead metal material, a tin-silver metal material, a tin-silver-copper metal material, a tin-zinc metal material, and a tin-zinc-bismuth metal material, a gold metal material, and a copper metal material.

In the flip-chip bonding step, the bump of the circuit surface side of the semiconductor chip 5 and the conductive material on the surface of the adherend 6 are connected by melting the conductive material. The temperature when the conductive material is molten is normally about 260° C. (250 to 300° C., for example). The film for the backside of a semiconductor integrated with a dicing tape of the present invention can have heat resistance so that it can resist a high temperature in the flip-chip bonding step by forming the film for the backside of a semiconductor with an epoxy resin, or the like.

In this step, the facing surface (an electrode forming surface) and the space between the semiconductor chip 5 and the adherend 6 are preferably washed. The washing liquid that is used in washing is not especially limited, and examples thereof include an organic washing liquid and a water washing liquid. The film for the backside of a semiconductor in the film for the backside of a semiconductor integrated with a dicing tape of the present invention has solvent resistance to the washing liquid, and does not substantially have solubility in these washing liquids. Because of that, various washing liquids can be used as the washing liquid, and washing can be performed by a conventional method without requiring a special washing liquid.

Next, a sealing step is performed to seal the space between the flip-chip bonded semiconductor chip 5 and the adherend 6. The sealing step is performed using a sealing resin. The sealing condition is not especially limited. Thermal curing of the sealing resin is performed normally by heating the sealing resin at 175° C. for 60 to 90 seconds. However, the present invention is not limited to this, and curing can be performed at 165 to 185° C. for a few minutes, for example. In the heat treatment in this step, thermal curing of not only the sealing resin but also of the film 2 for the backside of a semiconductor can be performed at the same time. With this operation, curing shrinkage of both the sealing resin and the film 2 for the backside of a semiconductor occurs as the thermal curing progresses. As a result, stress that is applied to the semiconductor chip 5 due to the curing shrinkage of the sealing resin can be canceled out or relieved by the curing shrinkage of the film 2 for the backside of a semiconductor. With this step, the film 2 for the backside of a semiconductor can be completely or almost completely thermally cured, and the layer can be pasted to the backside of the semiconductor element with excellent adhesion. Because the film 2 for the backside of a semiconductor according to the present invention can be thermally cured together with the sealing material in the sealing step even when the layer is uncured before this step, there is no necessity to add a new step to thermally cure the film 2 for the backside of a semiconductor.

The sealing resin is not especially limited as long as it is a resin having insulation properties, and can be appropriately selected from sealing materials such as a known sealing resin. However, an insulating resin having elasticity is preferable. Examples of the sealing resin include a resin composition containing an epoxy resin. Examples of the epoxy resin include epoxy resins described above. The sealing resin with a resin composition containing an epoxy resin may contain a thermosetting resin such as a phenol resin other than the epoxy resin, a thermoplastic resin, and the like as a resin component besides the epoxy resin. The phenol resin can also be used as a curing agent for the epoxy resin, and examples of the phenol resin include the above-described phenol resins.

Because the film for the backside of a semiconductor is pasted to the backside of a semiconductor chip in the semiconductor device (flip-chip mounted semiconductor device) that is manufactured using the film 1 for the backside of a semiconductor integrated with a dicing tape and the film 2 for the backside of a semiconductor, various markings can be performed with excellent visibility. Even when marking is performed by a laser marking method, marking can be performed with an excellent contrast ratio, and various information such as character information and graphic information marked by laser marking can be visually recognized well. A known laser marking apparatus can be used when performing laser marking. Various lasers such as a gas laser, a solid laser, and a liquid laser can be used. Specifically, the gas laser is not especially limited, and a known gas laser can be used. However, a carbon dioxide gas laser ($CO_2$ laser) and an excimer laser such as an ArF laser, a KrF laser, an XeCl laser, or an XeF laser are suitable. The solid laser is not especially limited, and a known solid laser can be used.

However, a YAG laser such as an Nd:YAG laser and a YVO$_4$ laser are suitable.

Because the semiconductor device that is manufactured using the film for the backside of a semiconductor integrated with a dicing tape and the film for the backside of a semiconductor of the present invention is a semiconductor device that is mounted by a flip-chip mounting method, the semiconductor device has a shape thinner and smaller than a semiconductor device that is mounted by a die bonding mounting method. Because of this, the semiconductor device can be suitably used as various electronic apparatuses and electronic parts or materials and members thereof. Specific examples of the electronic apparatus in which the flip-chip mounted semiconductor device of the present invention can be used include a portable phone, PHS, a small computer such as PDA (personal digital assistant), a notebook personal computer, Netbook (trademark), or a wearable computer, a small electronic apparatus in which a portable phone and a computer are integrated, Digital Camera (trademark), a digital video camera, a small television, a small game machine, a small digital audio player, an electronic organizer, an electronic dictionary, an electronic apparatus terminal for an electronic book, and a mobile electronic apparatus (portable electronic apparatus) such as a small digital type clock or watch. Examples of the electronic apparatus also include an electronic apparatus other than a mobile type apparatus (i.e., astationary apparatus) such as a desktop personal computer, a flat-panel television, an electronic apparatus for recording and playing such as a hard disc recorder or a DVD player, a projector, or a micromachine. Examples of the electronic parts or materials and members of the electronic apparatus and electronic parts include a component of CPU and components of various recording apparatuses such as a memory and a hard disk.

Preferred working examples of the present invention will be explained in detail below. However, the materials, the compounding amounts, and the like described in the working examples are not intended to limit the scope of the present invention thereto unless otherwise specified in a limitative manner. The "part(s)" in the working examples means "part(s) by weight."

Example 1

<Production of Adhesive Sheet>

In methylethylketone, 21 parts of an epoxy resin (trade name "Epikote 1004" manufactured by Japan Epoxy Resins Co., Ltd.), 22 parts of a phenol resin (trade name "Milex XLC-4L" manufactured by Mitsui Chemicals, Inc.), 69 parts of a spherical silica filler having an average particle size of 0.05 µm and a maximum particle size of 0.3 µm or less (manufactured by Admatechs Co., Ltd.), 5 parts of dye 1 (trade name "OIL GREEN 502" manufactured by Orient Chemical Industries Co., Ltd.) and 11 parts of dye 2 (trade name "OIL BLACK BS" manufactured by Orient Chemical Industries Co., Ltd.) to 100 parts of an acrylic ester-based polymer (trade name "Paracron W-197CM" manufactured by Negami Chemical Industrial Co., Ltd.) having ethyl acrylate-methyl methacrylate as a main component were dissolved to prepare an adhesive composition solution A having a solid content concentration of 23.6% by weight. In the present working examples, the term "solid content" means the total of the solid content of the resins, the spherical silica and the dye. The term "solid content concentration" means "% by weight" of the solid content with respect to the total of methylethylketone (solvent) and the solid content.

The adhesive composition solution A was applied onto a release-treated film consisting of a silicone release-treated polyethylene terephthalate film having a thickness of 50 µm as a release liner (separator), and dried at 130° C. for 2 minutes to form an adhesive sheet A having a thickness of 30 µm.

<Production of Adhesive Sheet Integrated with Dicing Tape>

The adhesive sheet A was pasted onto the pressure-sensitive adhesive layer of a dicing tape (trade name "V-8-T" manufactured by Nitto Denko Corporation; average thickness of the base: 65 µm, average thickness of the pressure-sensitive adhesive layer: 10 µm) by using a hand roller to produce an adhesive sheet A integrated with a dicing tape.

Example 2

<Production of Adhesive Sheet>

In methylethylketone, 21 parts of an epoxy resin (trade name "Epikote 1004" manufactured by Japan Epoxy Resins Co., Ltd.), 22 parts of a phenol resin (trade name "Milex XLC-4L" manufactured by Mitsui Chemicals, Inc.), 134 parts of a spherical silica filler having an average particle size of 0.05 µm and a maximum particle size of 0.3 µm or less (manufactured by Admatechs Co., Ltd.), 7 parts of dye 1 (trade name "OIL GREEN 502" manufactured by Orient Chemical Industries Co., Ltd.) and 14 parts of dye 2 (trade name "OIL BLACK BS" manufactured by Orient Chemical Industries Co., Ltd.) to 100 parts of an acrylic ester-based polymer (trade name "Paracron W-197CM" manufactured by Negami Chemical Industrial Co., Ltd.) having ethyl acrylate-methyl methacrylate as a main component were dissolved to prepare an adhesive composition solution B having a solid content concentration of 23.6% by weight.

The adhesive composition solution B was applied onto a release-treated film consisting of a silicone release-treated polyethylene terephthalate film having a thickness of 50 µm as a release liner (separator), and dried at 130° C. for 2 minutes to form an adhesive sheet B having a thickness of 30 µm.

<Production of Adhesive Sheet Integrated with Dicing Tape>

The adhesive sheet B was pasted onto the pressure-sensitive adhesive layer of a dicing tape (trade name "V-8-T" manufactured by Nitto Denko Corporation; average thickness of the base: 65 µm, average thickness of the pressure-sensitive adhesive layer: 10 µm) by using a hand roller to produce an adhesive sheet B integrated with a dicing tape.

Example 3

<Production of Adhesive Sheet>

In methylethylketone, 21 parts of an epoxy resin (trade name "Epikote 1004" manufactured by Japan Epoxy Resins Co., Ltd.), 22 parts of a phenol resin (trade name "Milex XLC-4L" manufactured by Mitsui Chemicals, Inc.), 40 parts of a spherical silica filler having an average particle size of 0.05 µm and a maximum particle size of 0.3 µm or less (manufactured by Admatechs Co., Ltd.), 4 parts of dye 1 (trade name "OIL GREEN 502" manufactured by Orient Chemical Industries Co., Ltd.) and 10 parts of dye 2 (trade name "OIL BLACK BS" manufactured by Orient Chemical Industries Co., Ltd.) to 100 parts of an acrylic ester-based polymer (trade name "Paracron W-197CM" manufactured by Negami Chemical Industrial Co., Ltd.) having ethyl acrylate-methyl methacrylate as a main component were dissolved to prepare an adhesive composition solution C having a solid content concentration of 23.6% by weight.

The adhesive composition solution C was applied onto a release-treated film consisting of a silicone release-treated polyethylene terephthalate film having a thickness of 50 μm as a release liner (separator), and dried at 130° C. for 2 minutes to form an adhesive sheet C having a thickness of 30 μm.

<Production of Adhesive Sheet Integrated with Dicing Tape>

The adhesive sheet C was pasted onto the pressure-sensitive adhesive layer of a dicing tape (trade name "V-8-T" manufactured by Nitto Denko Corporation; average thickness of the base: 65 μm, average thickness of the pressure-sensitive adhesive layer: 10 μm) by using a hand roller to produce an adhesive sheet C integrated with a dicing tape.

Example 4

<Production of Adhesive Sheet>

In methylethylketone, 70 parts of an epoxy resin (trade name "Epikote 1004" manufactured by Japan Epoxy Resins Co., Ltd.), 75 parts of a phenol resin (trade name "Milex XLC-4L" manufactured by Mitsui Chemicals, Inc.), 230 parts of a spherical silica filler having an average particle size of 0.05 μm and a maximum particle size of 0.3 μm or less (manufactured by Admatechs Co., Ltd.), 12 parts of dye 1 (trade name "OIL GREEN 502" manufactured by Orient Chemical Industries Co., Ltd.) and 24 parts of dye 2 (trade name "OIL BLACK BS" manufactured by Orient Chemical Industries Co., Ltd.) to 100 parts of an acrylic ester-based polymer (trade name "Paracron W-197CM" manufactured by Negami Chemical Industrial Co., Ltd.) having ethyl acrylate-methyl methacrylate as a main component were dissolved to prepare an adhesive composition solution D having a solid content concentration of 23.6% by weight.

The adhesive composition solution D was applied onto a release-treated film consisting of a silicone release-treated polyethylene terephthalate film having a thickness of 50 μm as a release liner (separator), and dried at 130° C. for 2 minutes to form an adhesive sheet D having a thickness of 30 μm.

<Production of Adhesive Sheet Integrated with Dicing Tape>

The adhesive sheet D was pasted onto the pressure-sensitive adhesive layer of a dicing tape (trade name "V-8-T" manufactured by Nitto Denko Corporation; average thickness of the base: 65 μm, average thickness of the pressure-sensitive adhesive layer: 10 μm) by using a hand roller to produce an adhesive sheet D integrated with a dicing tape.

Example 5

<Production of Adhesive Sheet>

In methylethylketone, 70 parts of an epoxy resin (trade name "Epikote 1004" manufactured by Japan Epoxy Resins Co., Ltd.), 75 parts of a phenol resin (trade name "Milex XLC-4L" manufactured by Mitsui Chemicals, Inc.), 68 parts of a spherical silica filler having an average particle size of 0.05 μm and a maximum particle size of 0.3 μm or less (manufactured by Admatechs Co., Ltd.), 7 parts of dye 1 (trade name "OIL GREEN 502" manufactured by Orient Chemical Industries Co., Ltd.) and 17 parts of dye 2 (trade name "OIL BLACK BS" manufactured by Orient Chemical Industries Co., Ltd.) to 100 parts of an acrylic ester-based polymer (trade name "Paracron W-197CM" manufactured by Negami Chemical Industrial Co., Ltd.) having ethyl acrylate-methyl methacrylate as a main component were dissolved to prepare an adhesive composition solution E having a solid content concentration of 23.6% by weight.

The adhesive composition solution E was applied onto a release-treated film consisting of a silicone release-treated polyethylene terephthalate film having a thickness of 50 μm as a release liner (separator), and dried at 130° C. for 2 minutes to form an adhesive sheet E having a thickness of 30 μm.

<Production of Adhesive Sheet Integrated with Dicing Tape>

The adhesive sheet E was pasted onto the pressure-sensitive adhesive layer of a dicing tape (trade name "V-8-T" manufactured by Nitto Denko Corporation; average thickness of the base: 65 μm, average thickness of the pressure-sensitive adhesive layer: 10 μm) by using a hand roller to produce an adhesive sheet E integrated with a dicing tape.

Comparative Example 1

<Production of Adhesive Sheet Integrated with Dicing Tape>

An adhesive sheet F integrated with a dicing tape according to Comparative Example 1 was produced in the same manner as for the adhesive sheet A integrated with a dicing tape according to Example 1, except that 134 parts of a spherical silica filler having an average particle size of 0.5 μm (trade name "SO-25R" manufactured by Admatechs Co., Ltd.) was added instead of adding 69 parts of a spherical silica filler having an average particle size of 0.05 μm and a maximum particle size of 0.3 μm or less (manufactured by Admatechs Co., Ltd.).

Comparative Example 2

<Production of Adhesive Sheet>

In methylethylketone, 70 parts of an epoxy resin (trade name "Epikote 1004" manufactured by Japan Epoxy Resins Co., Ltd.), 75 parts of a phenol resin (trade name "Milex XLC-4L" manufactured by Mitsui Chemicals, Inc.), 47 parts of a spherical silica filler having an average particle size of 0.05 μm and a maximum particle size of 0.3 μm or less (manufactured by Admatechs Co., Ltd.), 6 parts of dye 1 (trade name "OIL GREEN 502" manufactured by Orient Chemical Industries Co., Ltd.) and 16 parts of dye 2 (trade name "OIL BLACK BS" manufactured by Orient Chemical Industries Co., Ltd.) to 100 parts of an acrylic ester-based polymer (trade name "Paracron W-197CM" manufactured by Negami Chemical Industrial Co., Ltd.) having ethyl acrylate-methyl methacrylate as a main component were dissolved to prepare an adhesive composition solution G having a solid content concentration of 23.6% by weight.

The adhesive composition solution G was applied onto a release-treated film consisting of a silicone release-treated polyethylene terephthalate film having a thickness of 50 μm as a release liner (separator), and dried at 130° C. for 2 minutes to form an adhesive sheet G having a thickness of 30 μm.

<Production of Adhesive Sheet Integrated with Dicing Tape>

The adhesive sheet G was pasted onto the pressure-sensitive adhesive layer of a dicing tape (trade name "V-8-T" manufactured by Nitto Denko Corporation; average thickness of the base: 65 μm, average thickness of the pressure-sensitive adhesive layer: 10 μm) by using a hand roller to produce an adhesive sheet G integrated with a dicing tape.

Comparative Example 3

<Production of Adhesive Sheet>

In methylethylketone, 70 parts of an epoxy resin (trade name "Epikote 1004" manufactured by Japan Epoxy Resins Co., Ltd.), 75 parts of a phenol resin (trade name "Milex XLC-4L" manufactured by Mitsui Chemicals, Inc.), 286 parts of a spherical silica filler having an average particle size of 0.05 μm and a maximum particle size of 0.3 μm or less (manufactured by Admatechs Co., Ltd.), 13 parts of dye 1 (trade name "OIL GREEN 502" manufactured by Orient Chemical Industries Co., Ltd.) and 27 parts of dye 2 (trade name "OIL BLACK BS" manufactured by Orient Chemical Industries Co., Ltd.) to 100 parts of an acrylic ester-based polymer (trade name "Paracron W-197CM" manufactured by Negami Chemical Industrial Co., Ltd.) having ethyl acrylate-methyl methacrylate as a main component were dissolved to prepare an adhesive composition solution c having a solid content concentration of 23.6% by weight.

The adhesive composition solution H was applied onto a release-treated film consisting of a silicone release-treated polyethylene terephthalate film having a thickness of 50 μm as a release liner (separator), and dried at 130° C. for 2 minutes to form an adhesive sheet H having a thickness of 30 μm.

<Production of Adhesive Sheet Integrated with Dicing Tape>

The adhesive sheet H was pasted onto the pressure-sensitive adhesive layer of a dicing tape (trade name "V-8-T" manufactured by Nitto Denko Corporation; average thickness of the base: 65 μm, average thickness of the pressure-sensitive adhesive layer: 10 μm) by using a hand roller to produce an adhesive sheet H integrated with a dicing tape.

Comparative Example 4

<Production of Adhesive Sheet>

In methylethylketone, 100 parts of an epoxy resin (trade name "Epikote 1004" manufactured by Japan Epoxy Resins Co., Ltd.), 107 parts of a phenol resin (trade name "Milex XLC-4L" manufactured by Mitsui Chemicals, Inc.), 85 parts of a spherical silica filler having an average particle size of 0.05 μm and a maximum particle size of 0.3 μm or less (manufactured by Admatechs Co., Ltd.), 9 parts of dye 1 (trade name "OIL GREEN 502" manufactured by Orient Chemical Industries Co., Ltd.) and 21 parts of dye 2 (trade name "OIL BLACK BS" manufactured by Orient Chemical Industries Co., Ltd.) to 100 parts of an acrylic ester-based polymer (trade name "Paracron W-197CM" manufactured by Negami Chemical Industrial Co., Ltd.) having ethyl acrylate-methyl methacrylate as a main component were dissolved to prepare an adhesive composition solution I having a solid content concentration of 23.6% by weight.

The adhesive composition solution I was applied onto a release-treated film consisting of a silicone release-treated polyethylene terephthalate film having a thickness of 50 μm as a release liner (separator), and dried at 130° C. for 2 minutes to form an adhesive sheet I having a thickness of 30 μm.

<Production of Adhesive Sheet Integrated with Dicing Tape>

The adhesive sheet I was pasted onto the pressure-sensitive adhesive layer of a dicing tape (trade name "V-8-T" manufactured by Nitto Denko Corporation; average thickness of the base: 65 μm, average thickness of the pressure-sensitive adhesive layer: 10 μm) by using a hand roller to produce an adhesive sheet I integrated with a dicing tape.

Comparative Example 5

<Production of Adhesive Sheet>

In methylethylketone, 12 parts of an epoxy resin (trade name "Epikote 1004" manufactured by Japan Epoxy Resins Co., Ltd.), 13 parts of a phenol resin (trade name "Milex XLC-4L" manufactured by Mitsui Chemicals, Inc.), 118 parts of a spherical silica filler having an average particle size of 0.05 μm and a maximum particle size of 0.3 μm or less (manufactured by Admatechs Co., Ltd.), 6 parts of dye 1 (trade name "OIL GREEN 502" manufactured by Orient Chemical Industries Co., Ltd.) and 13 parts of dye 2 (trade name "OIL BLACK BS" manufactured by Orient Chemical Industries Co., Ltd.) to 100 parts of an acrylic ester-based polymer (trade name "Paracron W-197CM" manufactured by Negami Chemical Industrial Co., Ltd.) having ethyl acrylate-methyl methacrylate as a main component were dissolved to prepare an adhesive composition solution J having a solid content concentration of 23.6% by weight.

The adhesive composition solution J was applied onto a release-treated film consisting of a silicone release-treated polyethylene terephthalate film having a thickness of 50 μm as a release liner (separator), and dried at 130° C. for 2 minutes to form an adhesive sheet J having a thickness of 30 μm.

<Production of Adhesive Sheet Integrated with Dicing Tape>

The adhesive sheet J was pasted onto the pressure-sensitive adhesive layer of a dicing tape (trade name "V-8-T" manufactured by Nitto Denko Corporation; average thickness of the base: 65 μm, average thickness of the pressure-sensitive adhesive layer: 10 μm) by using a hand roller to produce an adhesive sheet J integrated with a dicing tape.

The compounding amounts of each of the examples and the comparative examples are summarized in Table 1. The content of the filler with respect to the entire adhesive sheet and the content of the acrylic resin with respect to entire resin components are also shown in Table 1.

TABLE 1

|  | Example 1 | Example 2 | Example 3 | Example 4 | Example 5 |
|---|---|---|---|---|---|
| Acrylic resin (parts by weight) | 100 | 100 | 100 | 100 | 100 |
| Epoxy resin (parts by weight) | 21 | 21 | 21 | 70 | 70 |

TABLE 1-continued

|  |  |  |  |  |  |
|---|---|---|---|---|---|
| Phenol resin (parts by weight) | 22 | 22 | 22 | 75 | 75 |
| Filler having average particle size of 0.05 μm (parts by weight) | 69 | 134 | 40 | 230 | 68 |
| Filler having average particle size of 0.5 μm (parts by weight) | — | — | — | — | — |
| Dye 1 (parts by weight) | 5 | 7 | 4 | 12 | 7 |
| Dye 2 (parts by weight) | 11 | 14 | 10 | 24 | 17 |
| Total (parts by weight) | 228 | 298 | 197 | 511 | 337 |
| Entire resin components (parts by weight) | 143 | 143 | 143 | 245 | 245 |
| Content of filler with respect to total (% by weight) | 30.3% | 45.0% | 20.3% | 45.0% | 20.2% |
| Content of acrylic resin with respect to entire resin components (% by weight) | 69.9% | 69.9% | 69.9% | 40.8% | 40.8% |

|  | Comparative Example 1 | Comparative Example 2 | Comparative Example 3 | Comparative Example 4 | Comparative Example 5 |
|---|---|---|---|---|---|
| Acrylic resin (parts by weight) | 100 | 100 | 100 | 100 | 100 |
| Epoxy resin (parts by weight) | 21 | 70 | 70 | 100 | 12 |
| Phenol resin (parts by weight) | 22 | 75 | 75 | 107 | 13 |
| Filler having average particle size of 0.05 μm (parts by weight) | — | 47 | 286 | 85 | 118 |
| Filler having average particle size of 0.5 μm (parts by weight) | 134 | — | — | — | — |
| Dye 1 (parts by weight) | 7 | 6 | 13 | 9 | 6 |
| Dye 2 (parts by weight) | 14 | 16 | 27 | 21 | 13 |
| Total (parts by weight) | 298 | 314 | 571 | 422 | 262 |
| Entire resin components (parts by weight) | 143 | 245 | 245 | 307 | 125 |
| Content of filler with respect to total (% by weight) | 45.0% | 15.0% | 50.1% | 20.1% | 45.0% |
| Content of acrylic resin with respect to entire resin components (% by weight) | 69.9% | 40.8% | 40.8% | 32.6% | 80.0% |

(Evaluation of Warpage)

First, a silicon wafer having a thickness of 100 μm was heated to 80° C. on a hot plate. Next, the adhesive sheet integrated with a dicing tape produced in each of the examples and the comparative examples was placed on the silicon wafer so that the adhesive sheet surface of the adhesive sheet integrated with a dicing tape faced the silicon wafer, and the adhesive sheet and the silicon wafer were pasted to each other by using a hand roller. Next, the silicon wafer was diced with the adhesive sheet into individual pieces of 10 mm×10 mm by using a dicer (manufactured by DISCO Corporation) to make a chip with an adhesive sheet. Next, the chip with an adhesive sheet was peeled from the dicing tape, and cured at 165° C. for 2 hours to obtain a chip with an adhesive sheet for evaluation.

The chip with an adhesive sheet for evaluation was placed on a flat stand so that the adhesive sheet faced downward, and the thickness was measured with a contact-type dial gauge. The thickness was measured from the surface of the stand to the farthest part of the chip from the surface of the stand. Next, an amount of warpage was calculated by subtracting the thickness of the wafer (100 μm) and the thickness of the adhesive sheet (30 μm) from the measured thickness. The case in which the amount of warpage was less than 100 μm was evaluated as "○," and the case in which the amount of warpage was 100 μm or more was evaluated as "x." The results are shown in Table 2.

(Evaluation of Contrast of Laser Marking)

First, a chip with an adhesive for evaluation according to each of the examples and the comparative examples was obtained by the same method as in the evaluation of warpage. Next, the chip with an adhesive sheet for evaluation was placed so that the adhesive sheet faced upward, and laser printing was performed under the following lighting conditions by using a laser printing apparatus (trade name "MD-S9900" manufactured by KEYENCE Corporation).

Lighting Conditions of Laser Printing
  Laser wavelength: 532 nm
  Laser power: 1.2 W
  Frequency: 32 kHz The laser-printed adhesive sheet was irradiated with oblique lighting from all directions to the adhesive sheet surface by using "CA-DDW8" (apparatus name) manufactured by KEYENCE Corporation, and the reflected light was captured by a CCD camera "CV-0350" (apparatus name) manufactured by KEYENCE Corporation. The brightness of the captured reflected light was measured by using "CV-5000" (apparatus name) manufactured by KEYENCE Corporation. The measurement of the brightness was performed on both the laser printed part and non-printed part. The brightness is a value calculated considering a white color as having a brightness of 100% and a black color as having a brightness of 0%, and in this description, it is measured by using "CV-5000" (apparatus name) manufactured by KEYENCE Corporation described above. A difference between the brightness of the laser-printed part and the brightness of the non-printed part was considered to be the contrast [%]. The case in which the contrast was 40% or more was evaluated as "○," and the case in which the contrast was less than 40% was evaluated as "x." The results are shown in Table 2.

(Measurement of Tensile Storage Elastic Modulus at 23° C. of Adhesive Sheet in Uncured State)

[Measurement of Tensile Storage Elastic Modulus]

The tensile storage elastic modulus at 23° C. of the adhesive sheet produced in each of the examples and the comparative examples was measured by using a viscoelasticity measurement apparatus (model: RSA-II manufactured by Rheometric Scientific, Inc.). Specifically, the produced adhesive sheet was cut into a sample of 30 mm long×5 mm wide, and the sample was set on a tool for film tensile measurement, and the tensile storage elastic modulus in the temperature range of −20° C. to 100° C. was measured under conditions of a frequency of 1 Hz, a strain of 0.01% and a temperature rise rate of 10° C./min. The results are shown in Table 2.

(Evaluation of Tackiness)

The adhesive sheet produced in each of the examples and the comparative examples was pasted onto a silicon wafer having a thickness of 500 μm, and it was diced into individual pieces of 10 mm square (dicing) to obtain a chip with an adhesive sheet. Next, the chip with an adhesive sheet was mounted on a polyethylene terephthalate film having a thickness of 50 μm so that the adhesive sheet surface and the polyethylene terephthalate film faced each other. Next, a weight of 50 g was placed on the chip to apply a load, and the chip was stored in an atmosphere of 40° C. for 3 days. Then, the weight was removed and the polyethylene terephthalate film was inverted. The case in which the chip with an adhesive sheet fell off without sticking to the polyethylene terephthalate film was evaluated as "◯," and the case in which the chip with an adhesive sheet stuck to the polyethylene terephthalate film without falling was evaluated as "x." The results are shown in Table 2.

TABLE 2

|  | Tensile storage elastic modulus (GPa) | Evaluation of Contrast | Evaluation of Warpage | Evaluation of Tackiness |
|---|---|---|---|---|
| Example 1 | 3.0 | ◯ | ◯ | ◯ |
| Example 2 | 1.5 | ◯ | ◯ | ◯ |
| Example 3 | 2.0 | ◯ | ◯ | ◯ |
| Example 4 | 3.0 | ◯ | ◯ | ◯ |
| Example 5 | 2.5 | ◯ | ◯ | ◯ |
| Comparative Example 1 | 1.0 | x | ◯ | ◯ |
| Comparative Example 2 | 2.0 | x | ◯ | ◯ |
| Comparative Example 3 | 4.0 | ◯ | x | ◯ |
| Comparative Example 4 | 3.2 | ◯ | x | ◯ |
| Comparative Example 5 | 0.8 | ◯ | ◯ | x |

DESCRIPTION OF REFERENCE SIGNS

1 Film for Backside of Semiconductor Integrated with Dicing Tape
2 Film for Backside of Flip-Chip Type Semiconductor (Film for Backside of Semiconductor
3 Dicing Tape
31 Base
32 Pressure-Sensitive Adhesive Layer
33 Portion Corresponding to Pasting Portion of Semiconductor Wafer
4 Semiconductor Wafer
5 Semiconductor Chip
51 Bump Formed on Circuit Surface Side of Semiconductor Chip
6 Adherend
61 Conductive Material for Bonding Applied onto Connection
Pad of Adherend 6

The invention claimed is:

1. An adhesive sheet used in manufacture of a semiconductor device, comprising a filler having an average particle size of less than 0.1 μm and an acrylic resin, wherein
   the content of the filler is in the range of 20 to 45% by weight with respect to the entire adhesive sheet, and
   the content of the acrylic resin is in the range of 40 to 70% by weight with respect to entire resin components.

2. The adhesive sheet according to claim 1, that is a film for the backside of a flip-chip type semiconductor to be formed on the backside of a semiconductor element that is flip-chip bonded onto an adherend.

3. The adhesive sheet according to claim 1, wherein the maximum particle size of the filler is 0.5 μm or less.

4. The adhesive sheet according to claim 1, wherein the filler is a silica filler.

5. The adhesive sheet according to claim 1, wherein the tensile storage elastic modulus at 23° C. of the adhesive sheet in an uncured state is 1.0 GPa to 3.0 GPa.

6. An adhesive sheet integrated with a dicing tape, comprising a dicing tape and the adhesive sheet according to claim 1 laminated on the dicing tape, wherein
   the dicing tape has a structure including a base and a pressure-sensitive adhesive layer laminated on the base, and
   the adhesive sheet is laminated on the pressure-sensitive adhesive layer.

7. A semiconductor device that is manufactured by using the adhesive sheet integrated with a dicing tape according to claim 6.

8. A method of manufacturing a semiconductor device using the adhesive sheet integrated with a dicing tape according to claim 6, comprising the steps of:
   pasting a semiconductor wafer onto the adhesive sheet of the adhesive sheet integrated with a dicing tape,
   dicing the semiconductor wafer to form a semiconductor element,
   peeling the semiconductor element from the pressure-sensitive adhesive layer of the dicing tape together with the adhesive sheet integrated with a dicing tape, and
   flip-chip bonding the semiconductor element onto an adherend.

* * * * *